United States Patent
Jun

[19]

[11] Patent Number: 5,945,706
[45] Date of Patent: Aug. 31, 1999

[54] MEMORY DEVICE

[75] Inventor: Young-Kwon Jun, Seoul, Rep. of Korea

[73] Assignee: LG Semicon Co., Ltd., Chungcheongbuk-do, Rep. of Korea

[21] Appl. No.: 09/030,206

[22] Filed: Feb. 25, 1998

Related U.S. Application Data

[62] Division of application No. 08/734,270, Oct. 21, 1990, Pat. No. 5,790,451.

[30] Foreign Application Priority Data

May 19, 1996 [KR] Rep. of Korea .................. 96-16463

[51] Int. Cl.$^6$ .................................................. H01L 29/788
[52] U.S. Cl. ............................................. 257/316; 257/315
[58] Field of Search ............................. 257/215, 250, 257/296, 300, 306, 314, 315, 316, 310

[56] References Cited

U.S. PATENT DOCUMENTS

| | | | |
|---|---|---|---|
| 4,872,042 | 10/1989 | Maeda et al. ................. | 365/149 |
| 5,220,530 | 6/1993 | Itoh ............................. | 365/149 |
| 5,355,330 | 10/1994 | Hisamoto et al. .............. | 365/149 |
| 5,463,234 | 10/1995 | Toriumi et al. ................ | 257/296 |

OTHER PUBLICATIONS

A Capacitorless DRAM Cell on SOI Substrate, Hsing-jen Wann and Chenming Hu, Department of Electrical Engineering and Computer Sciences, University of California at Berkeley, CA 94720, pp. 26.4.1 to 26.4.4.

*Primary Examiner*—Sara Crane

[57] ABSTRACT

A memory device and method of forming the same, includes a plurality of wordlines for applying a cell driving signal, a plurality of bitlines for inputting or outputting data, and a plurality of cells, each cell having a first gate, source and drain electrodes and a second gate, wherein either the first or second gate is connected to one of the wordlines, the source electrode is connected to one of the bitlines, and the drain electrode is connected to either the first or second gate which is not connected to the one wordline.

17 Claims, 26 Drawing Sheets

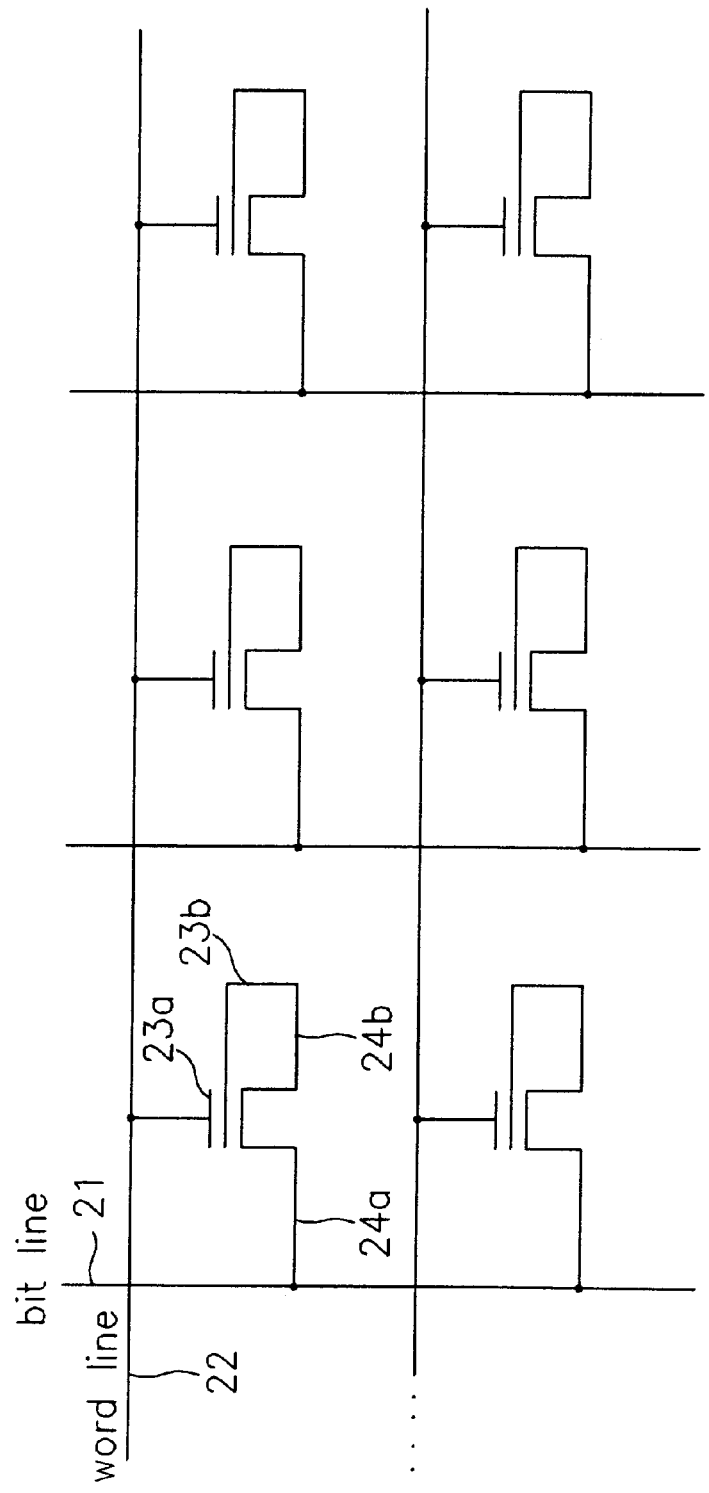

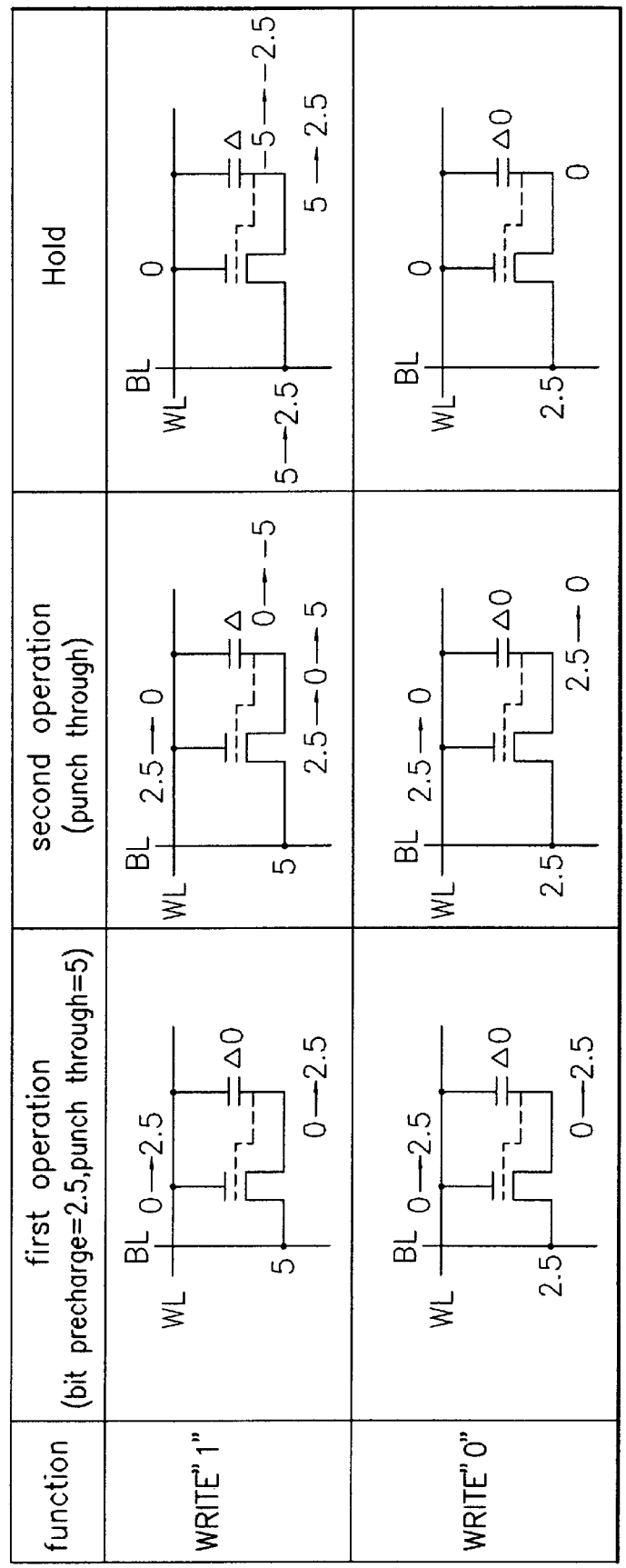

<characteristics of read cycle operation>

<characteristics of write cycle operation>

FIG.9B
<characteristics of read cycle operation>
| function | first operation (bit precharge=5) | second operation | Hold |
|---|---|---|---|
| READ "1" | 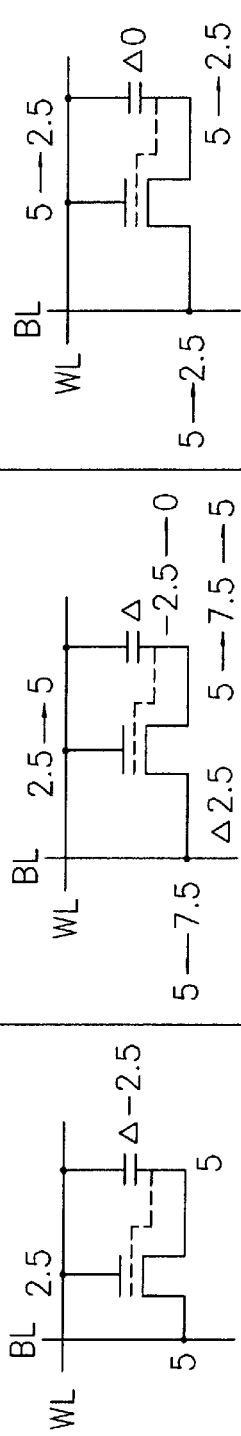 | 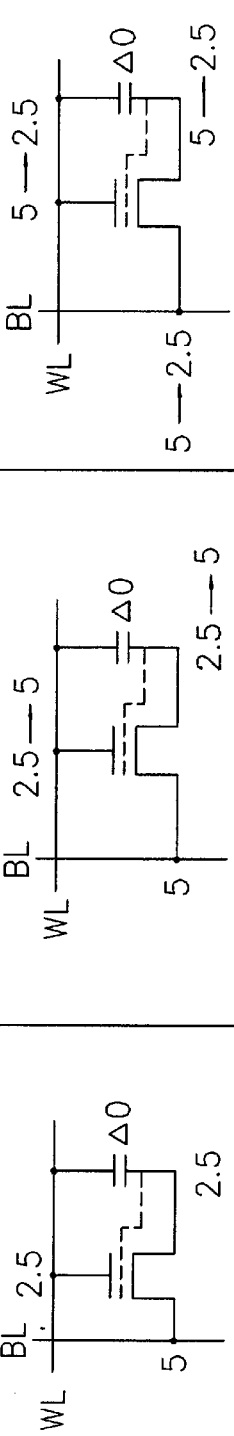 | 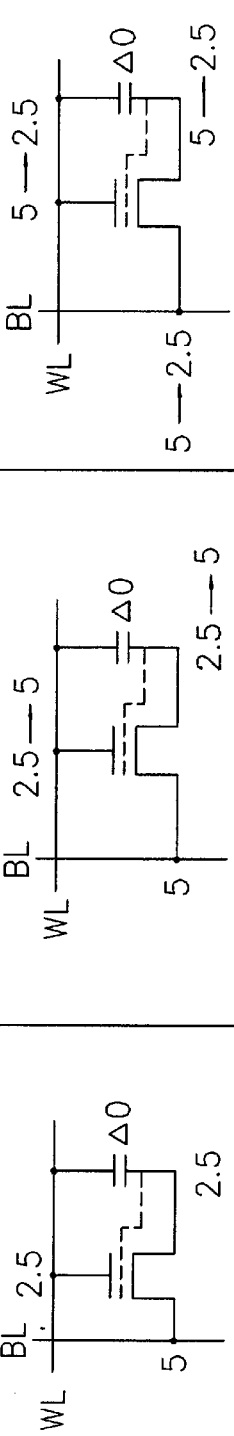 |
| READ "0" | 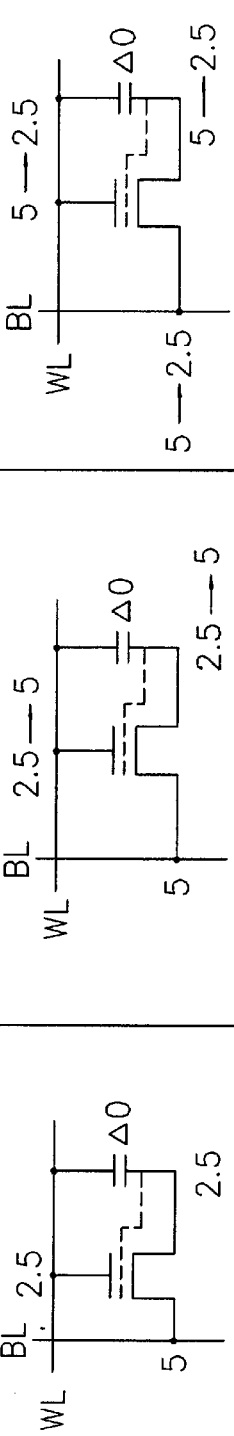 | 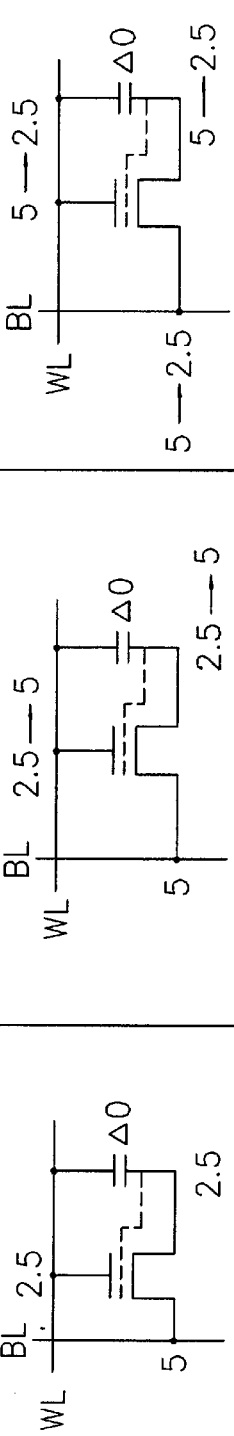 | 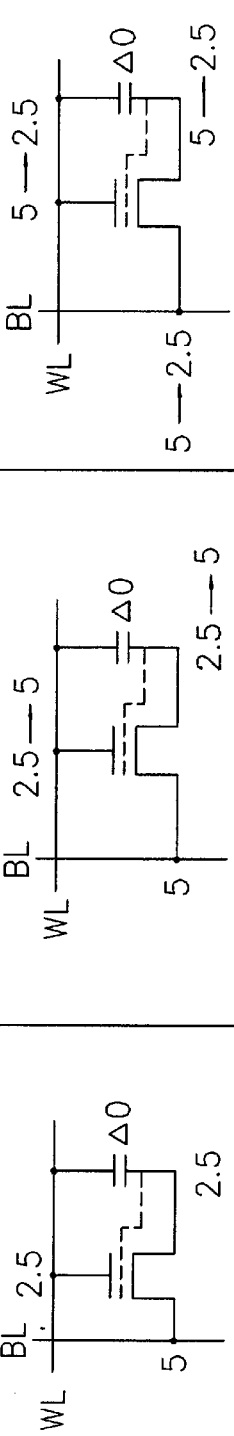 |

<characteristics of read cycle operation>

FIG.16A

<characteristics of write cycle operation>

FIG.16B

<characteristics of read cycle operation>

MEMORY DEVICE

This application is a divisional of application Ser. No. 08/734,270, filed Oct. 21, 1996 now U.S. Pat. No. 5,790,451.

BACKGROUND OF THE INVENTION

1. Field of the Invention

The present invention relates to a memory device and a method of fabricating the same and, more particularly, to a DRAM cell, a DRAM memory device and a method of fabricating the DRAM memory device having a plurality of DRAM cells.

2. Description of the Related Art

In general, a DRAM cell provides high capacity and low cost owing to its simple configuration which includes a single transistor and a single capacitor. In this regard, a DRAM cell has been widely used in a variety of electrical products and systems including a computer system. Recently, its application trend has been enlarged widely.

The use of a DRAM cell requires high integration is and high capacity in computers which occupies the DRAM market. It also requires increase in the processing speed. However, it is difficult for a conventional DRAM cell having a single transistor and a single capacitor to offer high integration due to limited process technology, such as, optical lithography using an infrared ray, which is generally adopted in fabricating a conventional DRAM cell.

A conventional DRAM cell will now be described with reference to the appended drawings.

FIG. 1 shows a circuit diagram of a conventional DRAM cell. The conventional DRAM cell includes a bitline, a wordline, a single access transistor, a single storage capacitor and a sensing amplifier (not shown). A gate of the access transistor is connected to the wordline. Source and drain electrodes of the access transistor are connected to the storage capacitor and the bitline, respectively. A cell plate electrode of the storage capacitor is connected to a reference voltage. An input port of the sensing amplifier is connected to the bitline and the other port of the amplifier is connected to the reference voltage.

A data from the bitline is stored in the storage capacitor through the source and drain electrodes of the access transistor when the access transistor is in the power-on state. The stored data is transferred to the bitline through the source and drain electrodes when the access transistor is in the power-on state again. A logic value of the data stored in the capacitor is determined by comparing a signal voltage thereon with the reference voltage of the bitline.

The capacitor of the DRAM cell generally includes a storage electrode of $n^+$ poly Si, a plate electrode and a dielectric layer between the storage and plate electrodes.

Data writing and data reading to and from the conventional DRAM cell having a configuration as aforementioned will now be described in detail.

Electrons are redistributed on the surface of the storage electrode under the dielectric layer due to a ½ Vcc voltage applied to the plate electrode in case no data is stored in the storage electrode. A depletion layer of the electrons is formed in the interface.

Generally, Vcc voltage is applied to the bitline and the wordline during the writing of data corresponding to logic '1'. As a result, a gate electrode voltage and a source electrode voltage of the access transistor increase up to the Vcc voltage level and the access transistor enters the power-on state.

In the storage electrode layer of the storage capacitor, ½ Vcc−Δ voltage, i.e., a voltage Δ dropped by the dielectric layer subtracted from the cell plate electrode voltage ½ Vcc, is applied. Therefore, since the electrons flow from the storage electrode layer having a high potential to the source electrode having a low potential, the depletion layer is enlarged in the storage electrode layer. In addition, the depletion layer remains in the storage electrode layer if the wordline voltage is dropped to a ground potential voltage. At this state, the stored binary code represents logic '1'.

For writing data corresponding to logic '0' in the memory cell, Vcc voltage is applied to the gate of the access transistor using the bitline voltage as a ground potential voltage.

In this case, the electrons flow from the source electrode having a high potential to the storage electrode layer having a low potential since ½ Vcc−Δ voltage in the storage electrode layer is higher than the source electrode voltage '0'. As a result, the electrons are accumulated in the storage electrode layer and the depletion layer is restored to an accumulation layer. The electrons remain in the storage electrode layer if the wordline voltage is dropped to the ground voltage. At this state, the stored binary code represents '0'.

Data reading of the conventional DRAM cell will be described below.

Vcc voltage is applied to the wordline under the state where the bitline is pre-charged at ½ Vcc voltage level. At this time, the access transistor is turned on to the power-on state and the data stored in the storage electrode layer of the capacitor is transferred to the bitline. The voltage of the bitline is varied depending on the stored charge quantity. This varied voltage is compared with the reference voltage of the bitline in a dummy cell, through the sensing amplifier having a function such as a comparator circuit. The voltage difference is amplified so that the logic value is determined to be '1' when the varied voltage of the bitline is higher than the reference voltage. In the alternative, the logic value is determined to be '0' when the varied voltage is lower than the reference voltage.

The voltage difference can be expressed as follows.

$$\Delta V = (\tfrac{1}{2}) Vcc\, Cs/(Cs+Cb)$$

where, Cs is a storage capacitance and Cb is a bitline capacitance.

The error of the logic value is reduced since higher the Cs/Cb ratio is higher the ΔV voltage is. However, the conventional DRAM cell has several problems.

The difference Δ between the bitline voltage capable of being discriminated by the sensing amplifier and the reference voltage is about 100–200 mV or more. Thus, the ratio γ(γ=Cs/Cb) of the storage capacitance for the bitline capacitance should be high. The area of the cell is considerably reduced if the density of the DRAM increases. Nevertheless, the capacity of the bitline and the sensitivity of the sensing amplifier are not improved. Furthermore, it is likely that the signal-to-noise ratio is reduced, and the cell transistor malfunctions.

Moreover, the reliability of the conventional DRAM cell may be degraded by a soft error due to α particle. That is, a pair of electron-holes are formed by ionization impact if α particle comes into collision with the semiconductor substrate. Minority carrier of the electron-holes is captured in the storage electrode to vary the charge quantity stored in the storage electrode. To eliminate such a soft error due to α particle, the area of the storage electrode has to increase in a three-dimensional extent or the dielectric layer having high dielectric ratio has to be formed. But, the electrons deteriorate exposure and etching processes because the electrons have high step differences.

In case of forming the dielectric layer, it is further difficult to achieve high integration of the conventional DRAM cell due to undesired characteristics, such as, a leakage current, a breakdown voltage, and lack of technology in fabricating a thin film.

SUMMARY OF THE INVENTION

Accordingly, the present invention is directed to a memory cell, a memory device and a method of fabricating the memory device having at least one memory cell, which substantially obviate one or more of the problems due to limitations and disadvantages of the related art.

An object of the present invention is to provide a memory cell, a memory device and a method of fabricating the memory device and/or memory cell, in which the memory cell includes a transistor, but no separate capacitor, such that the integration and reliability of the memory device is improved.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a memory cell according to the present invention includes a first gate, a source electrode connected to a bitline, a drain electrode and a second gate, wherein either the first or second gate is connected a wordline, and either the first or second gate, which is not connected to the wordline, is connected to the drain electrode, for writing and reading data of the bitline to and from the first or second gate which is connected to the drain electrode.

It is to be understood that both the foregoing general description and the following detailed description are exemplary and explanatory and are intended to provide further explanation of the invention as claimed.

Briefly described, the memory device according to the first embodiment of the present invention includes, a plurality of first and second impurity diffused regions formed on a semiconductor substrate, a gate insulating film formed on the semiconductor substrate between the first and second impurity diffused regions, a second gate formed in contact with the first impurity diffused regions, a dielectric layer formed on the second gate, a first gate formed on the dielectric layer, at least one wordline formed in contact with the first gate, and at least one bitline formed in contact with one of the second impurity diffused regions.

The method of fabricating a memory device according to the first embodiment of the present invention includes the steps of forming at least one first impurity diffused region on a semiconductor substrate; forming a second gate in contact with the one first impurity diffused region, a dielectric layer on the second gate, and a first gate on the dielectric layer; forming at least one wordline in contact with the first gate; forming a second impurity diffused region on the semiconductor substrate; and forming at least one bitline in contact with the second impurity diffused region.

The memory device according to another example of the first embodiment includes a plurality of first and second impurity diffused regions formed on a semiconductor substrate, a second gate formed on the semiconductor substrate between the first and second impurity diffused regions, an oxide film formed in contact with one of the second impurity diffused regions, a contact layer formed in contact with the first impurity diffused regions, a dielectric layer formed on the contact layer, a first gate formed on the dielectric layer, at least one wordline formed in contact with the first gate, and at least one bitline formed in contact with the one second impurity diffused region.

The method of fabricating a memory device according to another example of the first embodiment of the present invention includes the steps of forming a plurality of first and second impurity diffused regions on a semiconductor substrate; forming a second gate on the semiconductor substrate between the first and second impurity diffused regions; forming an oxide film in contact with one of the second impurity diffused regions; forming a contact layer in contact with the first impurity diffused regions, a dielectric layer on the contact layer, and a first gate on the dielectric layer; forming at least one wordline in contact with the first gate; and forming at least one bitline in contact with the one second impurity diffused region.

The memory device according to the second embodiment of the present invention includes a plurality of first and second impurity diffused regions formed on a semiconductor substrate, a second gate formed on the semiconductor substrate between the first and second impurity diffused regions, a dielectric layer formed on the second gate, a first gate formed on the dielectric layer, a first interleave insulting layer formed on the first gate, at least one wordline formed in contact with the second gate through the first interleave insulting layer, and at least one bitline formed in contact with one of the second impurity diffused regions.

The method of fabricating a memory device according to the second embodiment of the present invention includes the steps of forming a plurality of first and second impurity diffused regions on a semiconductor substrate; forming a second gate on the semiconductor substrate between the first and second impurity diffused regions, a dielectric layer on the second gate, and a first gate on the dielectric layer; forming a first interleave insulting layer on the first gate; forming at least one wordline in contact with the second gate through the first interleave insulting layer; and forming at least one bitline in contact with one of the second impurity diffused regions.

The memory device according to another example of the second embodiment of the present invention includes a plurality of first and second impurity diffused regions formed on a semiconductor substrate, a second gate formed on the semiconductor substrate between the first and second impurity diffused regions, a contact layer formed in contact with the second gate, a dielectric layer formed on the contact layer, a first gate formed on the dielectric layer and in contact with one of the first impurity diffused regions, at least one wordline formed on the in contact with the second gate, and at least one bitline formed in contact with the one second impurity diffused region.

The method of fabricating a memory device according to another example of the second embodiment of the present invention includes the steps of forming a plurality of first and second impurity diffused regions on a semiconductor substrate; forming a second gate on the semiconductor substrate between the first and second impurity diffused regions; forming a contact layer in contact with the second gate; forming a dielectric layer on the contact layer; forming a first gate on the dielectric layer and in contact with one of the first impurity diffused regions; forming at least one wordline in contact with the second gate; and forming at least one bitline in contact with one of the second impurity diffused regions.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the accompanying drawings, wherein

FIG. 3 is a circuit diagram of a DRAM device according to the first embodiment of the present invention;

FIGS. 8A, 8B and 8C show tables for explaining operation steps of a DRAM device according to the first embodiment of the present invention;

FIGS. 9A, 9B and 9C show tables for explaining another example of operation steps of a DRAM device according to the first embodiment of the present invention;

FIGS. 16A and 16B show tables for explaining another example of operation steps of a DRAM device according to the second embodiment of the present invention.

DETAILED DESCRIPTION OF THE PREFERRED EMBODIMENTS

Reference will now be made in detail to the preferred embodiments of the present invention, examples of which are illustrated in the accompanying drawings.

Figure 1:
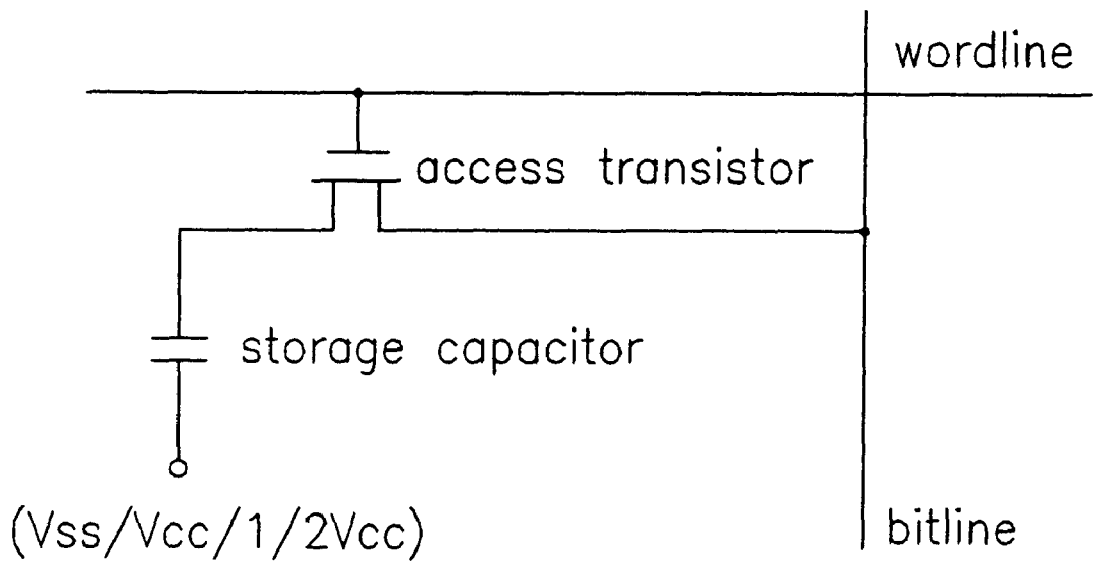
FIG. 1 is a circuit diagram of a conventional DRAM cell.
Figure 2A:
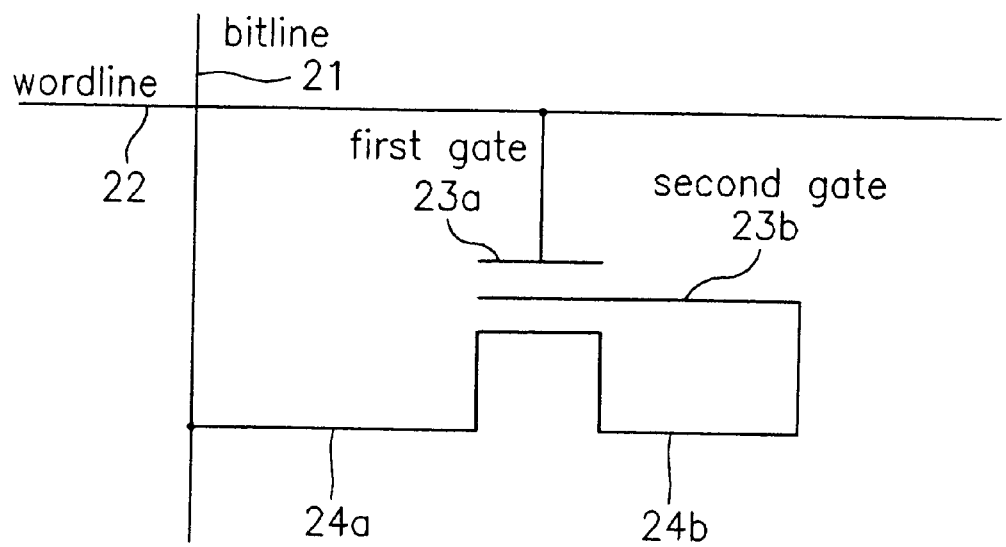
FIGS. 2A and 2B are circuit diagrams of a DRAM cell according to the embodiments of the present invention.
Figure 2B:
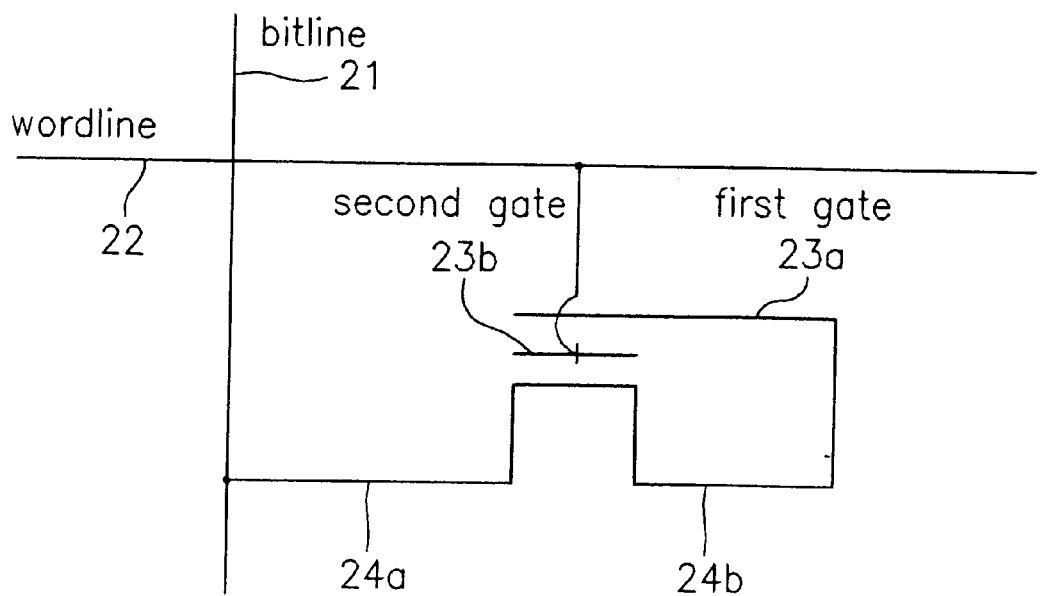

FIGS. 2A and 2B are circuit diagrams of a DRAM cell according to the embodiments of the present invention.

As shown in FIGS. 2A and 2B, the DRAM cell includes a first gate 23a, and an access transistor having a second gate 23b, a source electrode 24a and a drain electrode 24b. Either the first gate 23a or the second gate 23b can be connected to a wordline 22. Either the first gate 23a or the second gate 23b, which ever is not connected to the wordline 22, is then connected to either the source electrode 24a or the drain electrode 24b, which ever is not connected to a bitline 21. Here, the first gate 23a and the second gate 23b are separated from each other. Furthermore, either or both of first and second impurity diffused regions for forming source and drain electrodes are formed by ion implantation of impurities which are opposite type to those of a semiconductor substrate on which the first and second impurity diffused regions are formed.

A memory device having a plurality of the DRAM cells described hereinabove may comprise a different circuit diagram depending on which one of the first gate 23a and the second gate 23b is connected to the wordline 22. For example, in the first embodiment of the present invention, the first gate 23a disposed above the second gate 23b is connected to the wordline 22, as shown in FIG. 2A. In the second embodiment of the present invention, the second gate 23b disposed below the first gate 23a is connected to the wordline 22, as shown in FIG. 2B.

The circuit configuration of the DRAM device, i.e., the memory device, according to the first embodiment of the present invention will be described below.

FIG. 3 is a circuit diagram of a DRAM device according to the first embodiment of the present invention.

As shown in FIG. 3, the DRAM device includes a first gate 23a, an access transistor having a second gate 23b, a source electrode 24a and a drain electrode 24b, a wordline 22 connected to the first gate 23a, and a bitline 21 connected to the source electrode 24a of the access transistor. The drain electrode 24b is connected to the second gate 23b. The bitline 21 is connected to an input port of a sensing amplifier. The other input port of the sensing amplifier is connected to a reference voltage.

Data writing and reading operations of the DRAM device aforementioned will be described below.

First, the data writing operation will be described. The operation voltage is induced into the second gate 23b by applying a writing voltage to the first gate 23a through the wordline 22 to operate a cell transistor. At this time, the data from the bitline 21 is stored in the second gate 23b through the source and drain electrodes 24a and 24b.

Then, another voltage is applied to the first gate 23a through the wordline 22 or the writing voltage previously applied is maintained, in order to turn off the transistor. Thus, the data stored in the second gate 23b remains as it is and is maintained.

The reading operation of stored data will be described. The operation voltage is induced into the second gate 23b by applying a reading voltage to the first gate 23a through the wordline 22 to operate the transistor. The data is transferred to the bitline 21 through the source and drain electrodes 24a and 24b. The state of the data stored in the second gate 23b is determined by comparing the bitline voltage varied by the signal data transferred to the bitline 21 with the reference voltage of the bitline 21 in a dummy cell and amplifying them.

The DRAM device according to the first embodiment of the present invention will be described below.

Figure 4A:
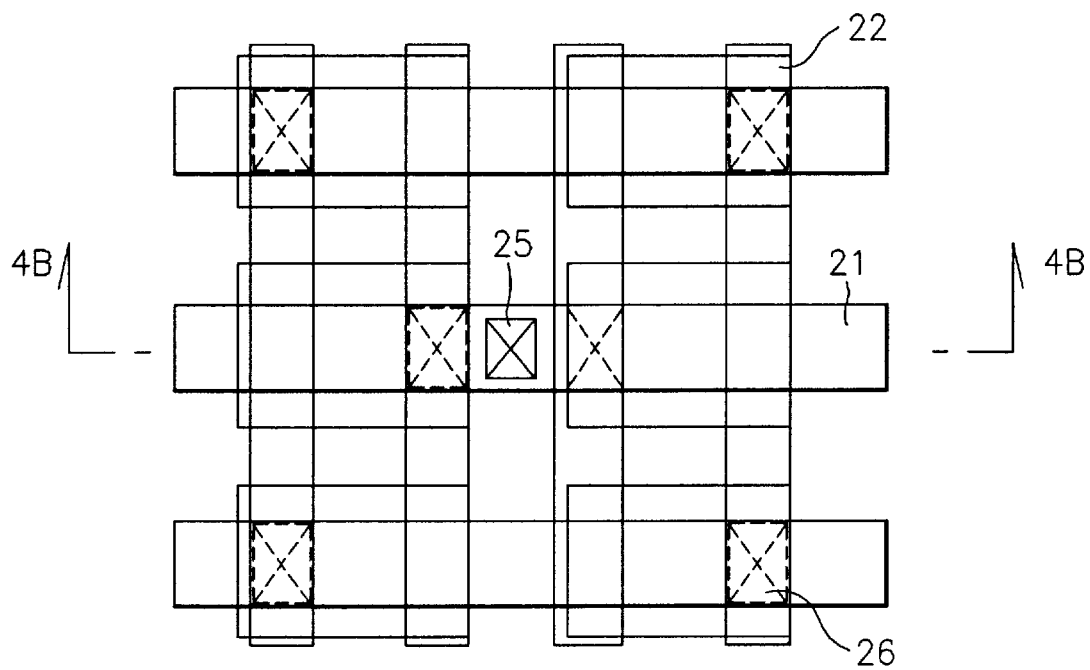
FIGS. 4A and 4B are layout and sectional views of a DRAM device, respectively, according to the first embodiment of the present invention.
Figure 4B:
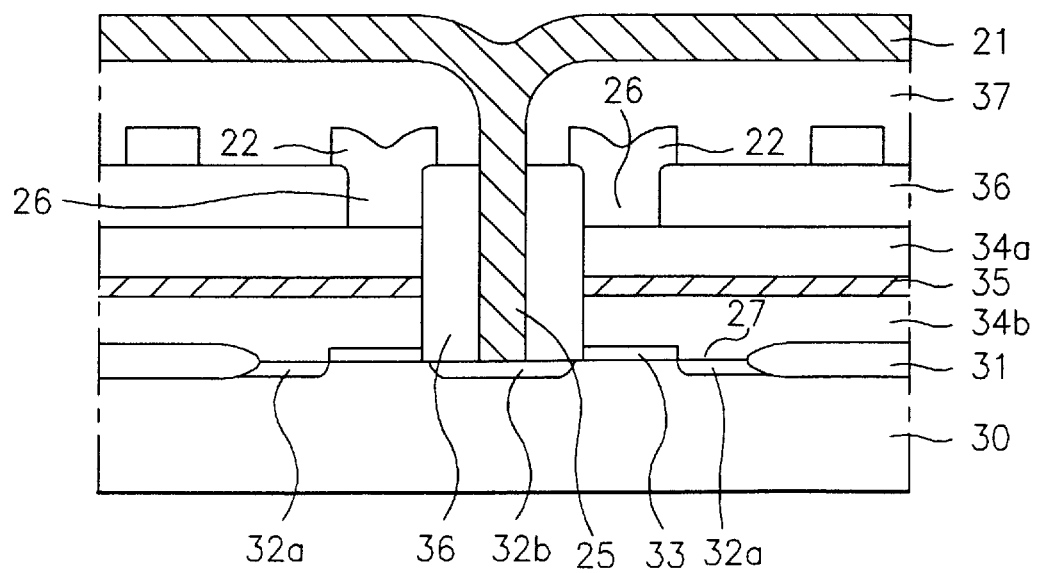

FIGS. 4A and 4B are layout and sectional views of the DRAM device according to the first embodiment of the present invention.

As shown in FIGS. 4A and 4B, the DRAM device includes a field oxide film 31 formed on an isolation region of a P-type semiconductor substrate 30, first and second impurity diffused regions 32a and 32b formed on an active region of the semiconductor substrate 30 defined by the field oxide film 31, a gate insulating film 33 formed on a channel region between the first and second impurity diffused regions 32a and 32b, a second gate 34b formed in contact with the first impurity diffused region 32a through a second gate contact hole 27, a dielectric layer 35 formed on the second gate 34b, a first gate 34a formed on the dielectric layer 35, a first interleave insulating film 36 formed on the first gate 34a and defining a wordline contact hole 26 at one side of the first gate 34a, a wordline 22 formed in contact with the first gate 34a through the wordline contact hole 26, a second interleave insulating film 37 formed on the entire surface including the wordline 22, and a bitline 21 being perpendicular to the wordline 22 and formed in contact with the second impurity diffused region 32b through a bitline contact hole 25 defined by the first interleave insulating film 36.

A method of fabricating the DRAM device shown in FIGS. 4A and 4B according to the first embodiment of the present invention will now be described.

FIGS. 5A to 5E are sectional views of the sequential process steps of the DRAM device shown in FIGS. 4A and 4B according to the first embodiment of the present invention.

Figure 5A:
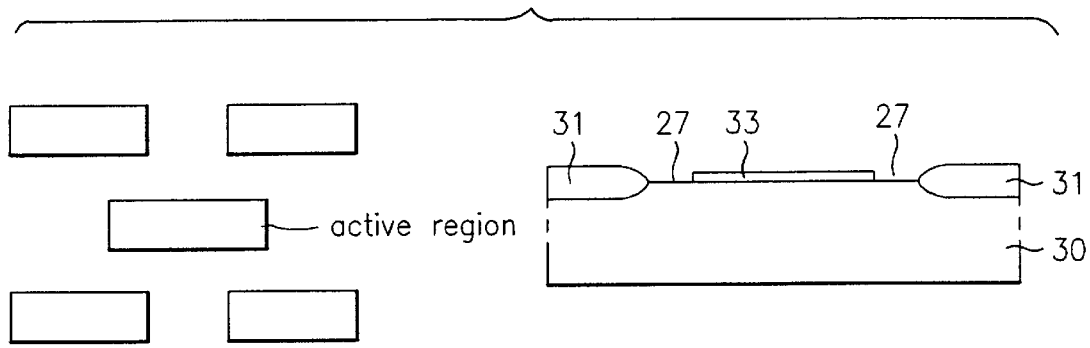
FIGS. 5A to 5E are sectional views for explaining sequential process steps of a DRAM device according to the first embodiment of the present invention.

As shown in FIG. 5A, a field oxide film 31 is formed on an isolation region of the semiconductor substrate 30 by a heat treatment in the ambient of $O_2$ using a pad oxide film and nitride film as a, mask for preventing oxidation. A gate insulating film 33 is formed on an active region of the semiconductor substrate 30. A second gate contact hole 27 is formed by selectively removing the gate insulating film 33 adjacent the field oxide film 31.

Figure 5B:
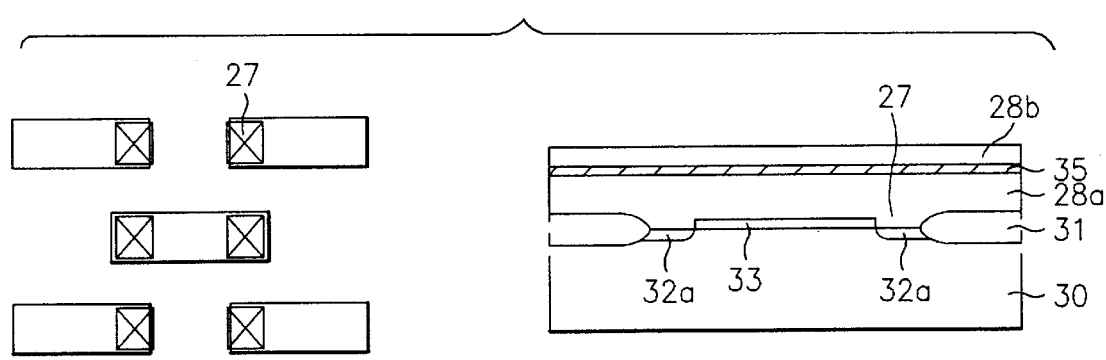

As shown in FIG. 5B, first impurity diffused regions 32a are formed by ion implantation of impurities of conductivity type opposite to that of the semiconductor substrate 30 on which the second gate contact hole 27 is formed. Then, a first polysilicon layer 28a is formed on the entire surface in contact with the first impurity diffused region 32a to form the second gate 34b. On the first polysilicon layer 28a, a dielectric layer 35 is formed with a certain thickness and a dielectric ratio of 3.0 or more, using a silicon oxide film having a thickness of 50–1000 A. The thickness and dielectric ratio of the dielectric layer 35 must be formed to induce a voltage of 0.1×V1 or more into the second gate 34b. The voltage 0.1 V1 (i.e., one tenth of voltage V1) for more is induced by applying a voltage V1 to the first gate 34a. A second polysilicon layer 28b is formed on the dielectric layer 35 to form the first gate 34a.

Figure 5C:
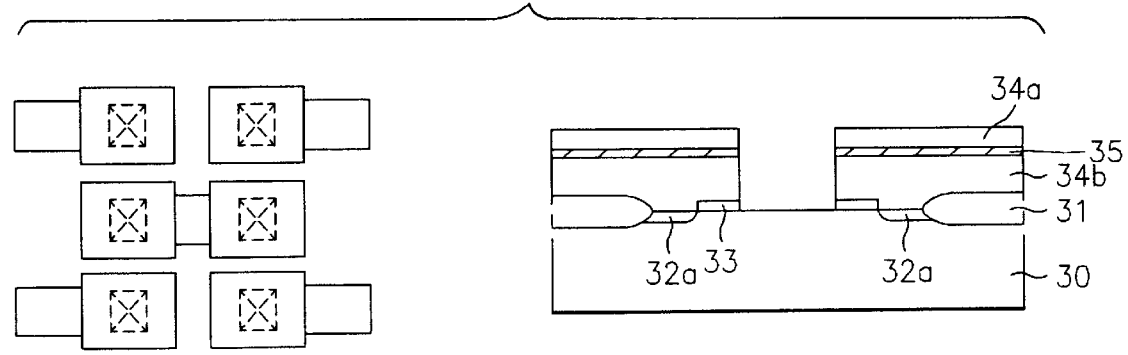

As shown in FIG. 5C, the second polysilicon layer 28b, the dielectric layer 35 and the first polysilicon layer 28a are selectively etched to form the first and second gates 34a and 34b, which are separately stacked up.

Figure 5D:
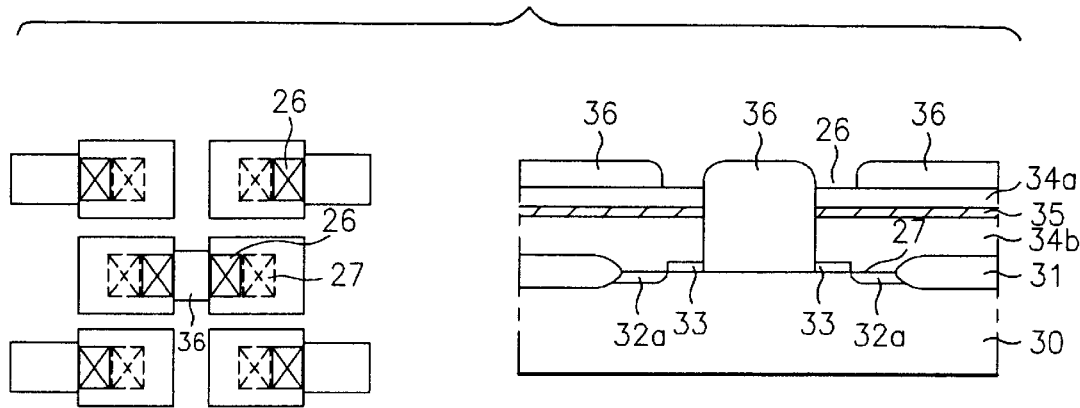

As shown in FIG. 5D, a first interleave insulating film 36 is formed over the entire surface thereof. Then, the first interleave insulating film 36 is selectively etched to form the wordline contact holes 26.

Figure 5E:
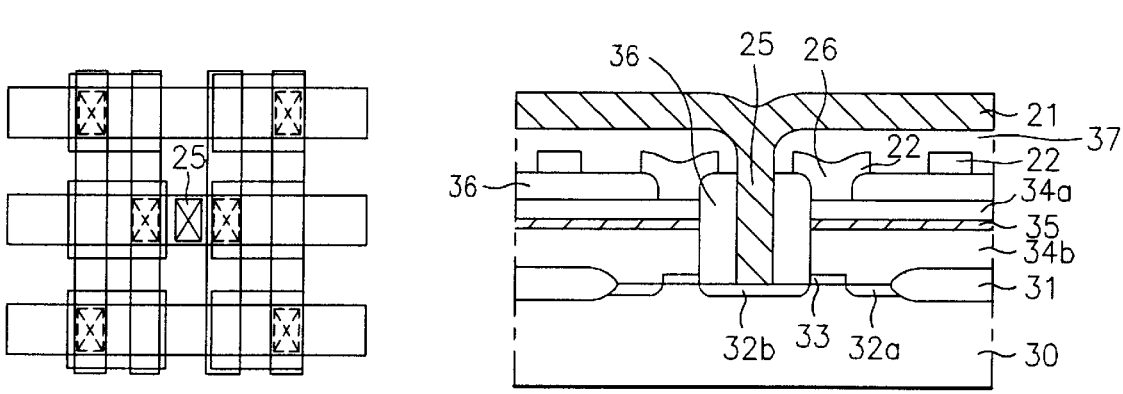

As shown in FIG. 5E, in order to form the wordlines 22, a conductivity type material is deposited and patterned on the entire surface including the wordline contact holes 26.

Then a second interleave insulating film 37 is formed on the entire surface including the wordlines 22. Subsequently, a portion of the second interleave insulating film 37 and a portion of the first interleave insulating film 36 are selectively removed to form a bitline contact hole 25.

Then, the second impurity diffused region 32b is formed by ion implantation of impurities into the semiconductor substrate 30 through the bitline contact hole 25. Thereafter, a conductivity type material is deposited and patterned on the entire surface including the bitline contact hole 25 to form the bitline 21.

Another example of the DRAM device according to the first embodiment of the present invention will be described below.

Figure 6A:
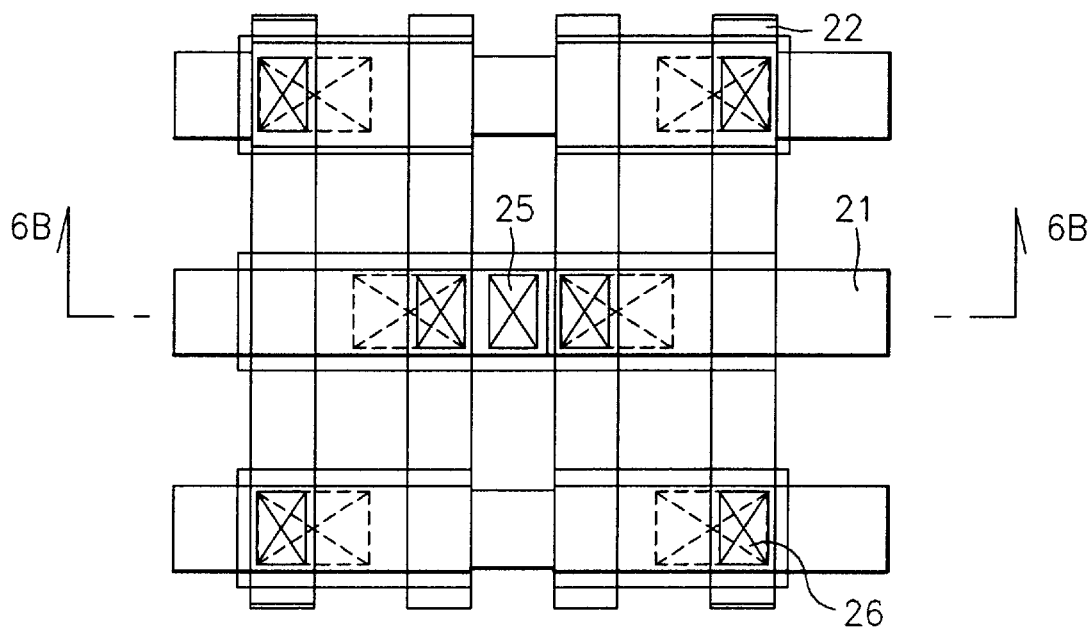
FIGS. 6A and 6B are another example of layout and sectional views of a DRAM device according to the first embodiment of the present invention.
Figure 6B:
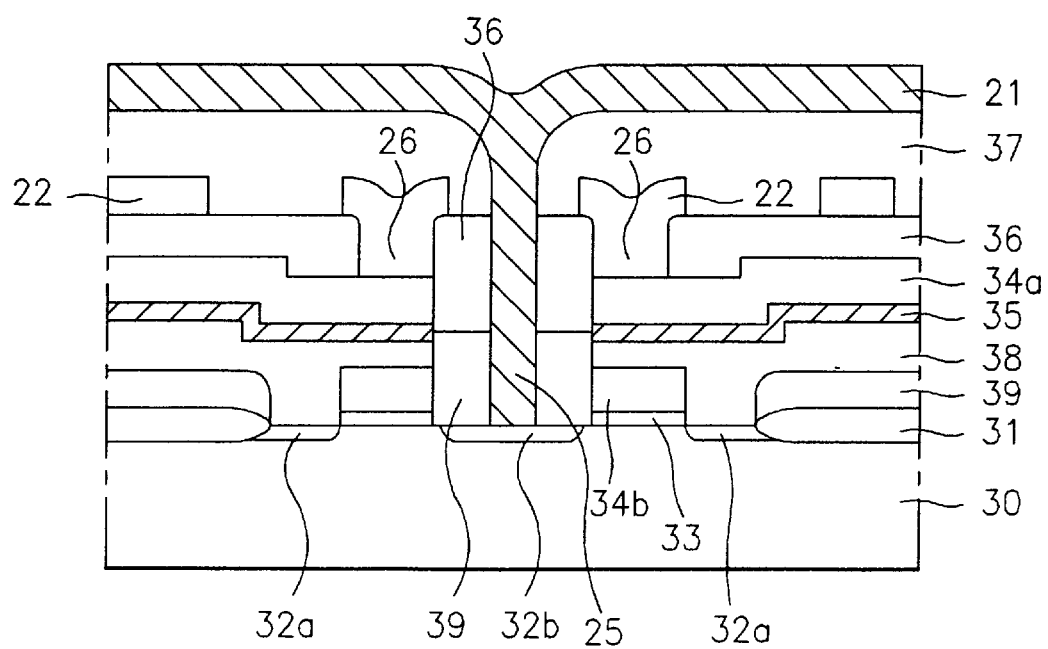

FIGS. 6A and 6B are another example of layout and sectional views of the DRAM device according to the first embodiment of the present invention.

As shown in FIGS. 6A and 6B, the memory device includes the second gate 34b below the first gate 34a, and the first impurity diffused regions 32a separately located from the second gate 34b. More specifically, the memory device includes a field oxide film 31 formed on an isolation region of the P-type semiconductor substrate 30, first and second impurity diffused regions 32a and 32b formed on an active region of the semiconductor substrate 30 defined by the field oxide film 31, and a gate insulating film 33 formed on a channel region between the first and second impurity diffused regions 32a and 32b.

The DRAM device further includes a second gate 34b formed on the gate insulating film 33, an inner layer or impurity diffused region contact layer 38 formed in contact with the first impurity diffused region 32a and the second gate 34b, a dielectric layer 35 formed on the impurity diffused region contact layer 38, a first gate 34a formed on the dielectric layer 35, a first interleave insulating film 36 formed to define a wordline contact hole 26 at one side of the first gate 34a, and a wordline 22 formed in contact with the first gate 34a through the wordline contact hole 26.

The DRAM device further includes a second interleave insulating film 37 formed on the entire surface including the wordline 22, and a bitline 21 formed perpendicular to the wordlines 22 and in contact with the second impurity diffused region 32b through the bitline contact hole 25, which is formed through the second interleave insulating film 37, the first interleave insulting film 36 and the oxide film 39.

A method of fabricating the DRAM memory device shown in FIGS. 6A and 6B according to the first embodiment of the present invention will be described as follows.

FIGS. 7A to 7E are sectional views of sequential process steps of the DRAM device shown in FIGS. 6A and 6B according to the first embodiment of the present invention.

Figure 7A:
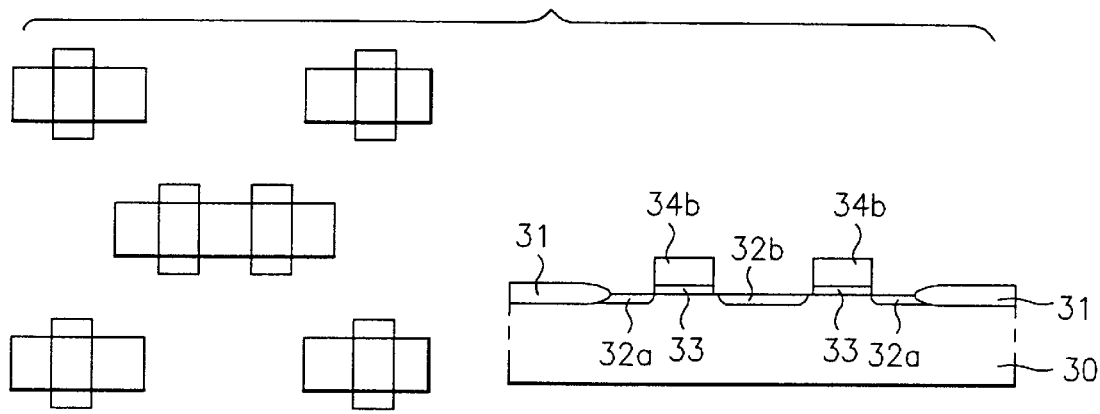
FIGS. 7A to 7E are sectional views for explaining another example of sequential process steps of a DRAM device according to the first embodiment of the present invention.

First, as shown in FIG. 7A, a field oxide film 31 is formed on an isolation region of the semiconductor substrate 30 by a heat treatment in the ambient of $O_2$ using a pad oxide film and a nitride film as a mask for the prevention of oxidation. A gate insulating film 33 is formed on the semiconductor substrate 30 in the active region defined by the field oxide film 31.

Then, a first polysilicon layer is formed on the gate insulating film 33 and patterned to form a second gate 34b. Subsequently, first and second impurity diffused regions 32a and 32b are formed by ion implantation of impurities such as P and As in case of n-MOS, and B and Sb in case of p-MOS using the second gate 34b as a mask.

Figure 7B:
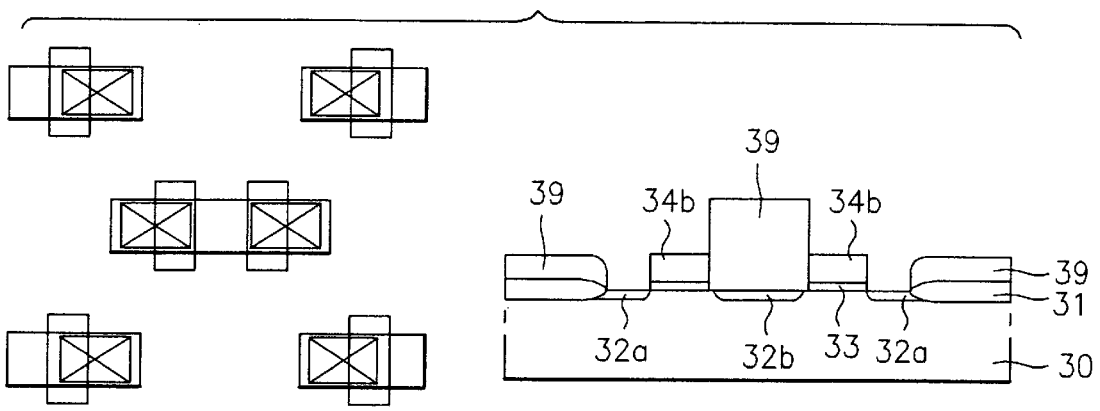

As shown in FIG. 7B, an oxide film 39 is formed with a thickness thicker than that of the second gate 34b on the entire surface, except the first impurity diffused region 32a.

Figure 7C:
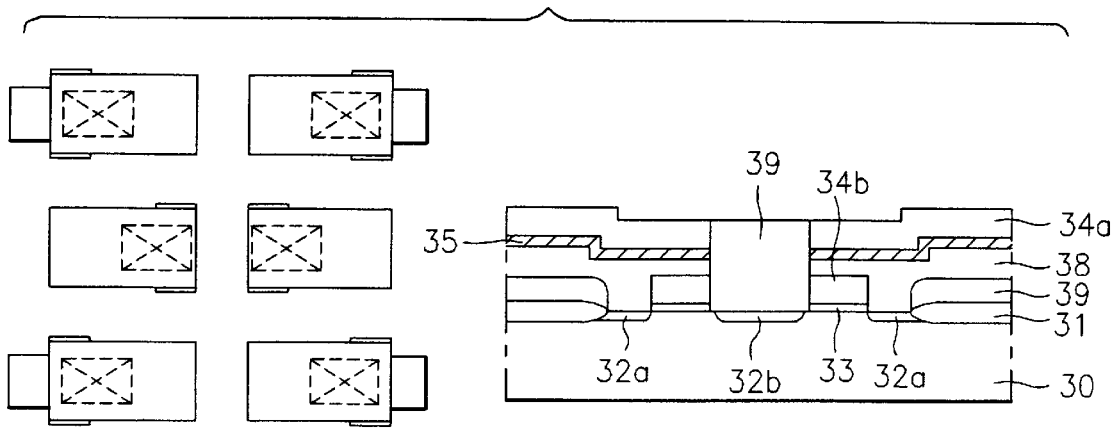

As shown in FIG. 7C, an impurity diffused region contact layer 38 is formed by using a polysilicon on the second gate 34b by low pressure chemical vapor deposition (LPCVD), and contacts the first impurity diffused region 32a. The impurity diffused region contact layer 38 has the same height as the oxide film 39. However, the impurity diffused region contact layer 38 does not have the uniform height due to the field oxide film 31 disposed at one side thereof.

Subsequently, on the impurity diffused region contact layer 38, a dielectric layer 35 is formed with a certain thickness and a dielectric ratio of 3.0 or more, using a silicon oxide film having a thickness of 50–1000 A. The thickness and dielectric ratio of the dielectric layer 35 must be formed to induce a voltage of 0.1 V1 or more into the second gate 34b. The voltage 0.1 V1 (one tenth of voltage V1) or more is induced from a voltage V1 applied to the first gate 34a. On the dielectric layer 35, a second polysilicon layer is deposited and patterned as the first gate 34a. The second polysilicon layer, the dielectric layer 35 and the impurity diffused region contact layer 38 are selectively etched to form the first and second gates 34a and 34b. Here, the first and second gates 34a and 34b are separated from each other.

Figure 7D:
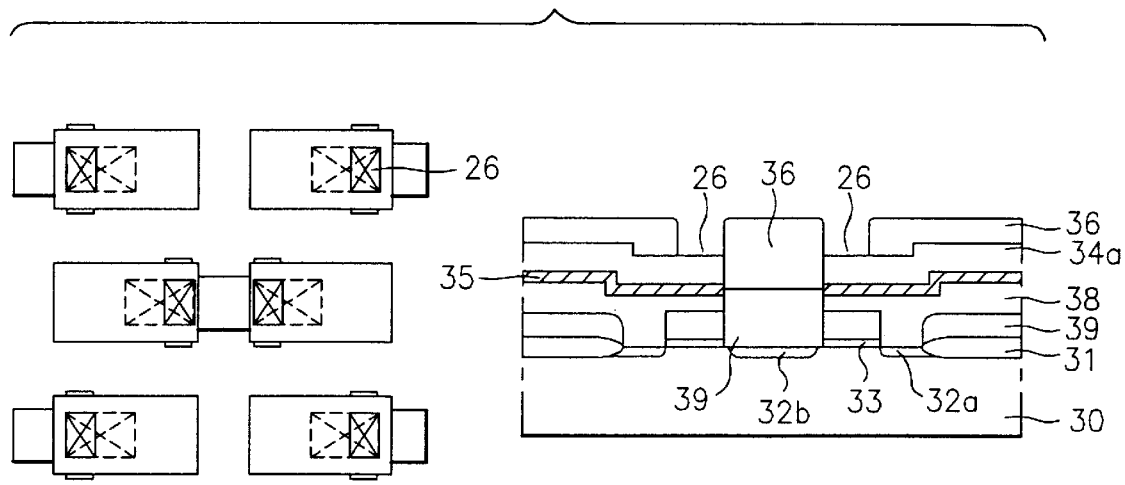

As shown in FIG. 7D, a first interleave insulating film 36 is deposited over the formed substrate and selectively etched to form a wordline contact hole 26.

Figure 7E:
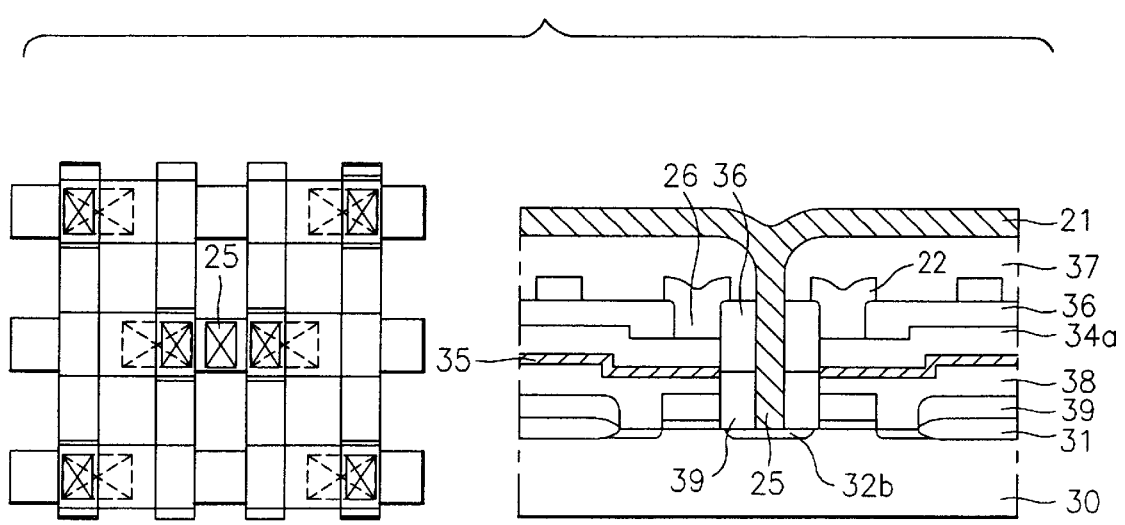

As shown in FIG. 7E, a conductivity type material is deposited and patterned on the entire surface including the wordline contact hole 26 to form a wordline 22.

A second interleave insulating film 37 is formed on the entire surface including the wordline 22. Then, the second interleave insulating film 37, the first interleave insulating film 36 and the oxide film 39 are selectively removed to form a bitline contact hole 25. On the second interleave insulating film and in the bitline contact hole, a conductivity type material is deposited and patterned to form a bitline 21.

The data writing, data reading and data refreshing of the memory device according to the first embodiment of the present invention may be classified into two operation steps, depending on a voltage applied to the bitline and the wordline at the standby state.

First, one operation step of the memory device according to the first embodiment of the present invention will be described with reference to FIGS. 8A, 8B and 8C.

In general, at the standby state, a ground potential voltage VG or low voltage VL of the semiconductor substrate 30 is applied to the wordline 22 so that the cell transistor is in the power-off state. As a result, the drain electrode 24b is electrically disconnected with the bitline 21.

The data writing operation steps according to the first embodiment of the present invention will be described referring to FIG. 8A.

The writing operation of a logic value '1' is as follows.

In the power-off state of the cell transistor, a high voltage VH of 5 V is applied to the bitline 21 and the wordline 22 is selected so that a writing voltage of 2.5 V (which is more than a threshold voltage capable of operating a cell transistor) is applied to the first gate 23a. As a result, the high voltage VH is induced on the second gate 23b and the drain electrode 24b connected to the second gate 23b, by a capacitive coupling. Thus, the power-off state of the cell transistor is maintained.

When the voltage applied to the wordline 22 becomes as low as the ground potential voltage of 0 V, the electron potential of the drain electrode 24b connected to the second gate 23b becomes as low as the ground potential voltage by a capacitive coupling. Therefore, the voltage difference between the source electrode 24a and the drain electrode 24b increases as high as 5 V, which results in a punch through voltage. As a result, the electron potential energy −qVG of the drain electrode 24b becomes higher than the electron potential energy −qVH of the bitline 21, so that the electrons flow from the second gate 23b to the bitline 21. Thus, the voltage of the drain electrode 24b becomes as high as 5 V due to the flow of electrons to the bitline 21.

Since the electron potential of the bitline 21 becomes identical to that of the drain electrode 24b if the voltage of the drain electrode 24b is high, a charge is not transferred any more and the charge corresponding to the voltage −VH is accumulated at both ports of the capacitor.

Then, when the voltage of the bitline 21 becomes as low as ½ VH while maintaining the ground potential voltage in the wordline 22, the cell transistor enters the power-on state and the potential energy −qVG of the drain electrode 24b becomes lower than the potential energy −½ qVH of the bitline 21. Consequently, the electrons flow from the bitline 21 to the second gate 23b.

If the electrons flow to the second gate 23b, the voltage of the second gate 23b becomes as low as ½ VH so that the electron potential energy of the bitline 21 is the same as that of the drain electrode 24b. Thus, the induced charge is stored and maintained and the cell transistor enters the power-off state. That is, at this time, data corresponding to −½ VH is stored in the capacitor and this data remains until the data reading is performed.

The writing operation of a logic value '0' is as follows.

A ground potential voltage or low voltage VL is applied to the bitline 21 and the wordline 22 is selected so that a writing voltage VH of 2.5 V (which is more than the threshold voltage for operating a cell transistor) is applied to the first gate 23a. As a result, the high voltage VH is induced into the second gate 23b and the drain electrode 24b connected to the second gate 23b by a capacitive coupling. Thus, the power-off state of the cell transistor is maintained.

When the voltage applied to the wordline 22 becomes as low as the ground potential voltage of 0 V, the electron potential of the drain electrode 24b connected to the second gate 23b becomes as low as the ground potential voltage by a capacitive coupling. Therefore, voltage at the source and drain electrodes 24a and 24b is either identical to that of the second gate 23b or higher, which places the cell transistor in the power-off state. The electrical path between the source electrode 24a and the drain electrode 24b is then intercepted. In this situation, when the voltage applied to the wordline 22 becomes as low as the ground potential voltage of 0 V, the electron potential energy of the drain electrode 24b connected to the second gate 23b becomes as low as the ground potential voltage. Thus, the cell transistor continues to be in the poweroff state. Consequently, data corresponding to 0 V is stored in the capacitor, and the data remains until the data reading is performed.

The data reading operation steps will be described referring to FIG. 8B.

The reading operation of a logic value '1' is as follows.

First, the bitline 21 is pre-charged and a reference voltage ½ VH of 2.5 V is applied to the precharged bitline 21. Then, the wordline 22 is selected so that a reading voltage VH' of 2.5 V (which is more than a threshold voltage capable of operating a cell transistor) is applied to the first gate 23a at the standby state of the wordline 22 having a voltage of 0 V.

When the data of a logic value '1' is stored in the second gate 23b, a high voltage ½ VH+VH' of 5 V is induced into the second gate 23b and the drain electrode 24b connected to the second gate 23b, by a capacitive coupling. As a result, the cell transistor switches to the power-on state.

As aforementioned, when the cell transistor is in the power-on state, a potential energy −½ qVH of the bitline 21 becomes higher than the electron potential energy −q(½ VH+VH') of the drain electrode 24b. Thus, the electrons flow from the bitline 21 to the drain electrode 24b and then a charge corresponding to VH' is applied to the bitline 21.

In addition, the voltage of the drain electrode 24b becomes as low as ½ VH so that the electron potential of the bitline 21 is identical to the electron potential ½ VH of the drain electrode 24b. Therefore, the induced charge is not transferred any more and the charge corresponding to the voltage VH'−½ VH is accumulated in the capacitor. In addition, the cell transistor switches to the power-off state.

Thereafter, when the voltage of the wordline 22 becomes as low as the ground potential voltage VG, the voltage of the second gate 23b, i.e., the voltage of the drain electrode 24b, becomes as low as ½ VH−VH' of 0 V. The cell transistor continues to be in the power-off state.

The reading operation of a logic value '0' is as follows.

First, in case where data corresponding to the logic value '0' is stored in the second gate 23b, the bitline 21 is pre-charged and a reference voltage ½ VH of 2.5 V is applied to the pre-charged bitline 21. Then, the wordline 22 is selected so that a reading voltage VH' of 2.5 V (which is more than the threshold voltage capable of operating a cell transistor) is applied to the first gate 23a at the standby state of the wordline 22 having a voltage of 0 V. When the reading voltage is applied to the first gate 23a, a high voltage VH' is induced into the second gate 23b and the drain electrode 24b connected to the second gate 23b, by a capacitive coupling. As a result, the cell transistor switches to the power-off state.

At this time, if the voltage applied to the wordline 22 becomes as low as the ground potential voltage of 0 V, the electron potential of the drain electrode 24b connected to the second gate 23b becomes as low as the ground potential voltage. Then, the voltage of the source electrode 24a or the drain electrode 24b becomes identical to that of the second gate 23b or higher so that the cell transistor switches to the power-on state and the path between the source electrode 24a and the drain electrode 24b is intercepted. Thus, data corresponding to 0 V is stored in the capacitor, and the data remains until the writing operation or the refreshing operation is performed.

The data refreshing operation will be described with reference to FIG. 8C.

The data of a DRAM cell is erased unless it is periodically refreshed. The data refreshing operation of the present invention is similar to a data writing operation using binary codes in a memory cell.

At the standby state, a ground potential voltage VG or a low voltage VL of the semiconductor substrate is applied to the wordline 22, the cell transistor is in the power-off state, and the drain electrode 24b is disconnected with the bitline 21.

After performing the reading operation of data corresponding to a logic value '1' or '0' under a punch through voltage of 5 V, the writing operation of data corresponding to a logic value '1' is performed as follows.

First, a high voltage VH of 5 V is applied to the bitline 21 and the wordline 22 is selected so that a writing voltage VH' of 2.5 V (which is more than the threshold voltage capable of operating a cell transistor) is applied to the first gate 23a. As a result, the high voltage VH' is induced into the second gate 23b and the drain electrode 24b connected to the second gate 23b, by a capacitive coupling. Thus, the power-off state of the cell transistor is maintained.

When the voltage applied to the wordline 22 becomes as low as the ground potential voltage of 0 V, the electron potential of the drain electrode 24b connected to the second gate 23b becomes as low as the ground potential voltage by a capacitive coupling.

Therefore, a voltage difference between the source electrode 24a and the drain electrode 24b increases as high as 5 V, which results in a punch through voltage. Since the electron potential energy −qVG of the drain electrode 24b is higher than the electron potential energy −qVH of the bitline 21, the electrons flow from the second gate 23b to the bitline 21. The voltage of the drain electrode 24b becomes high again due to the electron flow toward the bitline 21.

As aforementioned, since the electron potential of the bitline 21 becomes identical to that of the drain electrode 21 if the voltage of the drain electrode 24b is high, the induced charge is not transferred any more and the charge corresponding to a voltage −VH is accumulated at both ports of the capacitor.

When the voltage of the bitline 21 becomes as low as ½ VH as the ground potential voltage in the wordline 22 is maintained, the cell transistor is in power-on state so that the potential energy −qVH of the drain electrode 24b becomes lower than the potential energy −½ qVH of the bitline 21. Consequently, the electrons flow from the bitline 21 to the second gate 23b.

If the electrons flow to the second gate 23b, the voltage of the second gate 23b becomes as low as ½ VH so that the electron potential energy of the bitline 21 is the same as that of the drain electrode 24b. Thus, the induced charge is not transferred any more and the cell transistor switches to the power-off state. At this time, data corresponding to −½ VH is stored in the capacitor and the data remains until the data reading is performed.

After performing the reading operation of data corresponding to a logic value '1' or '0' under a punch through voltage of 5 V, the writing operation of data corresponding to a logic value '0' is performed as follows.

First, a high voltage VH of 5 V is applied to the bitline 21 and the wordline 22 is selected so that a writing voltage VH of 2.5 V (which is more than the threshold voltage capable of operating a cell transistor) is applied to the first gate 23a. Since a voltage difference between the second gate 23b and the drain electrode 24b becomes as low as the ground potential voltage by a capacitive coupling, the voltage difference is identical to the voltage of the second gate 23b or higher. Thus, the power-off state of the cell transistor is maintained.

That is, the path between the source electrode 24a and the drain electrode 24b is intercepted. At this time, when the voltage applied to the wordline 22 becomes as low as the ground potential voltage of 0 V, the electron potential of the drain electrode 24b becomes as low as the ground potential voltage by a capacitive coupling.

Consequently, the cell transistor continues to be in the power-off state and data corresponding to 0 V is stored in the capacitor. The data remains until the data reading is performed.

In accordance with the above described data writing and reading operations, data corresponding to a logic value '1' or '0' can be stored in the second gate 23b and the stored data can only be read in case that the logic value '1' is stored.

Figure 8B:
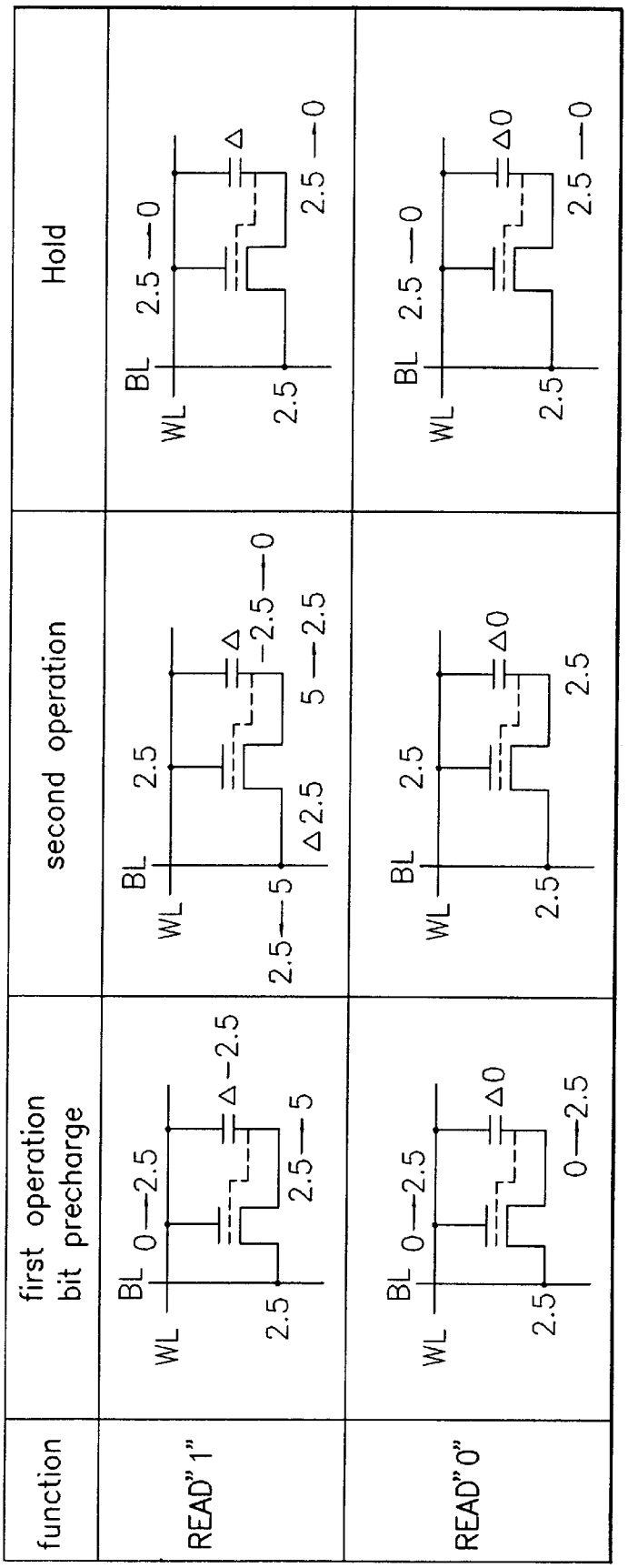
Figure 8C:
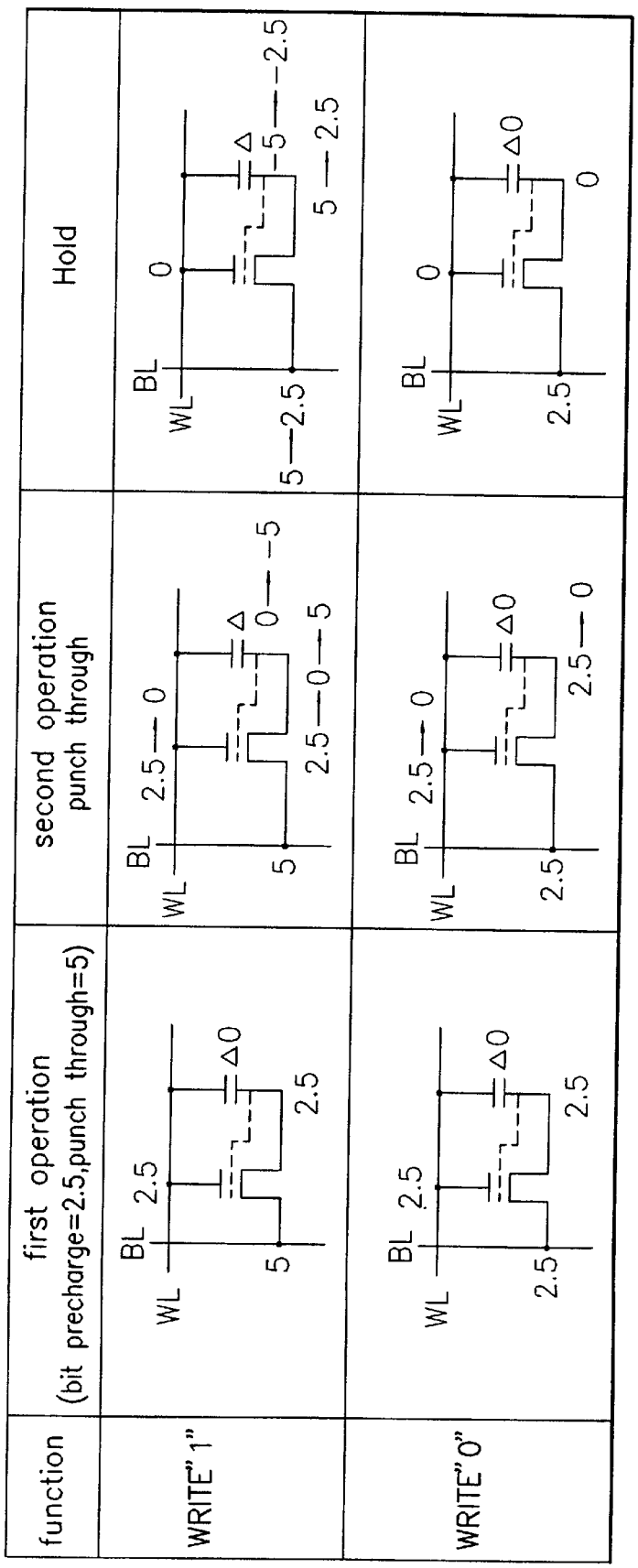

In the read cycle operation as shown in FIG. 8B, a signal corresponding to VH of 2.5 V is applied to the bitline 21 if the stored logic value is '1', whereas no signal is applied to the bitline 21 if the stored logic value is '0'. Thus, the stored data can be discriminated.

Figure 9A:
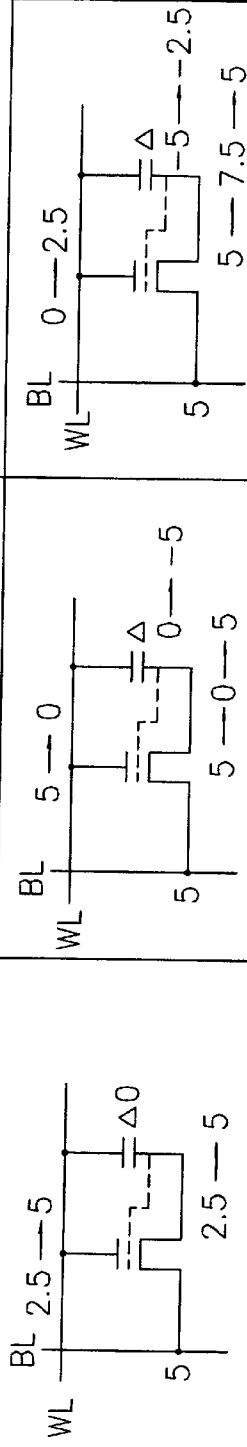
Figure 9C:
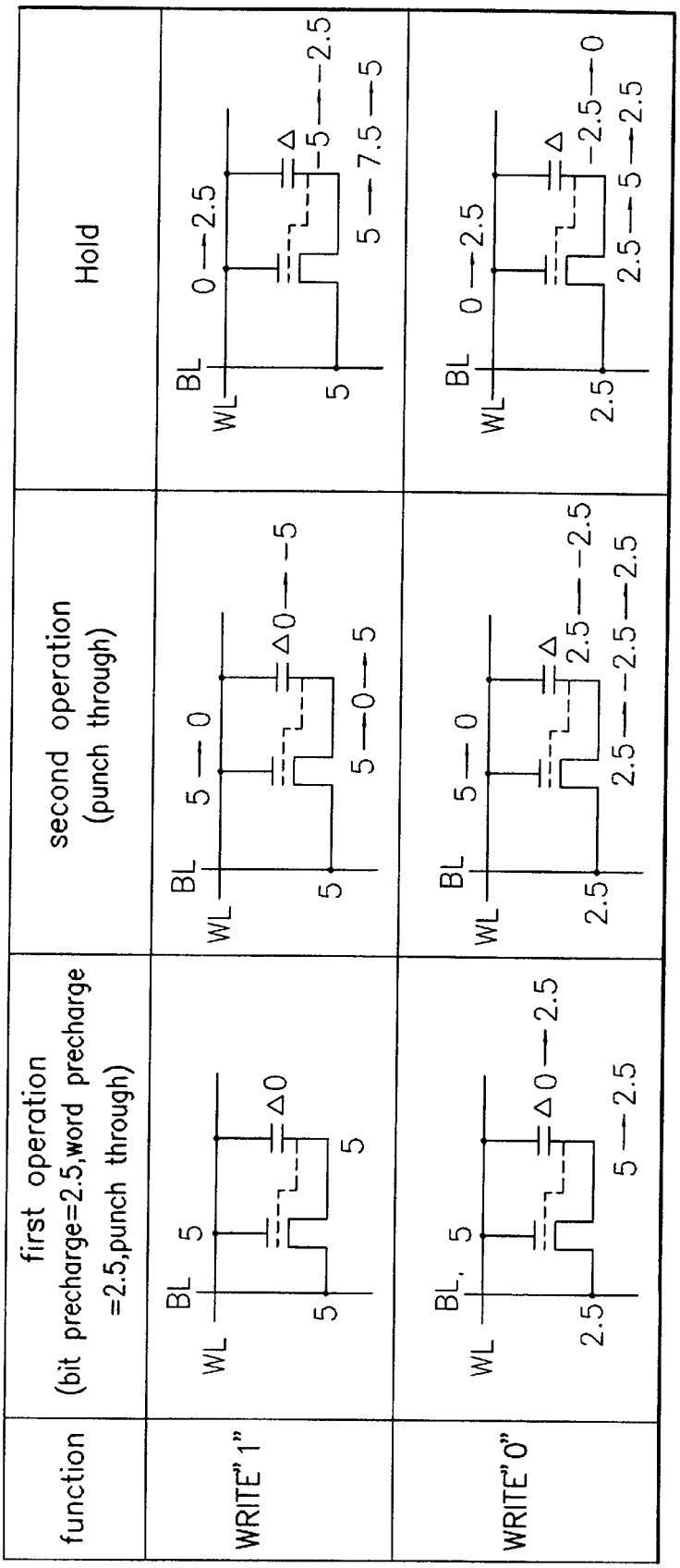

FIGS. 9A, 9B and 9C show another example of operation steps of the DRAM device according to the first embodiment of the present invention.

In the write cycle operation as shown in FIG. 9A, the wordline 22 is pre-charged with ½ VH (e.g., 2.5 V). Then, the voltage of the wordline 22 decreases from VH (e.g., 5 V) to the ground potential voltage, which results in a punch through voltage in the cell transistor. Thereafter, the voltage of the wordline 22 becomes as high as ½ VH again so that data corresponding to -½ VH is stored in the capacitor when the voltage of the bitline 21 is VH. On the other hand, data corresponding to 0 V is stored in the capacitor when the voltage of the bitline 21 is ½ VH.

In the read cycle operation as shown in FIG. 9B, the bitline 21 is pre-charged with VH of 5 V. Then, the voltage of the wordline 22 increases from the pre-charged voltage ½ VH to VH so that the voltage of the bitline 21 is varied. Thereafter, the voltage of the wordline 22 decreases to ½ VH not to vary the voltage of the bitline 21.

The refresh cycle as shown in FIG. 9C is identical to the first write cycle as shown in FIG. 8A.

The memory device according to the second embodiment of the present invention will now be described below.

Figure 10:
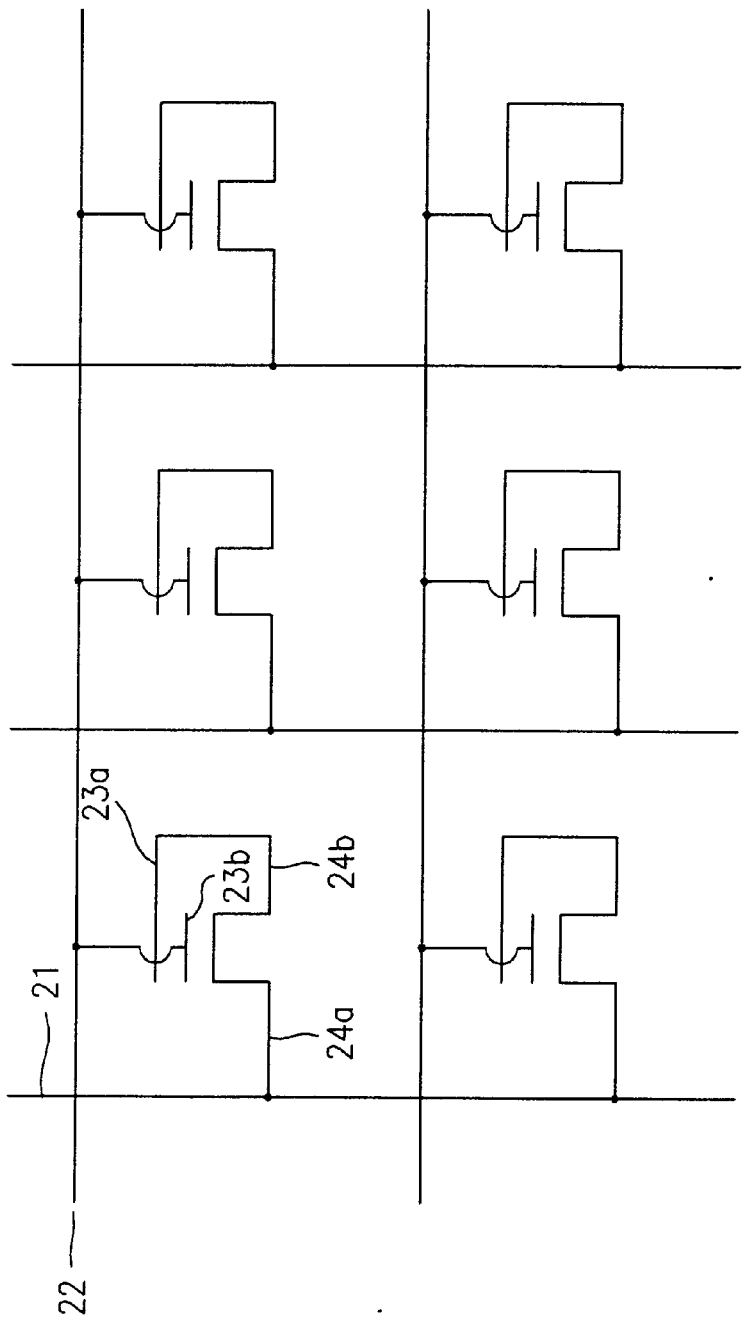
FIG. 10 is a circuit diagram of a DRAM device according to the second embodiment of the present invention.

FIG. 10 is a circuit diagram of a DRAM device according to the second embodiment of the present invention.

As shown in FIG. 10., the memory device includes a first gate 23a, an access transistor having a second gate 23b, a source electrode 24a and a drain electrode 24b, a wordline 22 connected to the second gate 23b, and a bitline 21 connected to the source electrode 24a. Here, the first gate 23a is connected to the drain electrode 24b. An input port of a sensing amplifier is connected to the bitline 21, whereas the other input port of the sensing amplifier is connected to a reference voltage.

The data reading and writing operation according to the second embodiment of the present invention will be described below.

First, the data writing operation according to the second embodiment of the present invention is as follows.

A writing voltage is applied to the second gate of the transistor through the wordline 22 and an operating voltage is induced into the first gate 23a, so that the cell transistor is activated. At this time, data from the bitline 21 gets stored in the first gate 23a through the path between the source and drain electrodes 24a and 24b.

If the data is stored in the first gate 23a, the writing voltage is maintained as it is or another voltage is applied to the second gate 23b through the wordline 22, in order to prevent operation of the cell transistor. Thus, the data is maintained as stored in the first gate 23a.

Meanwhile, the data reading operation is as follows.

A reading voltage is applied to the second gate 23b through the wordline 22 to induce the reading voltage into the first gate 23a. Then, the data is transferred to the bitline 21 through the path between the source and drain electrodes 24a and 24b to operate the transistor.

The voltage of the bitline 21 representing the transferred data is compared with a reference voltage of the bitline 21 in a dummy cell. Then, the two voltages are amplified to determine the state of the data stored in the first gate 23a.

The memory device according to the second embodiment of the present invention will be described with reference to FIGS. 11A and 11B.

Figure 11A:
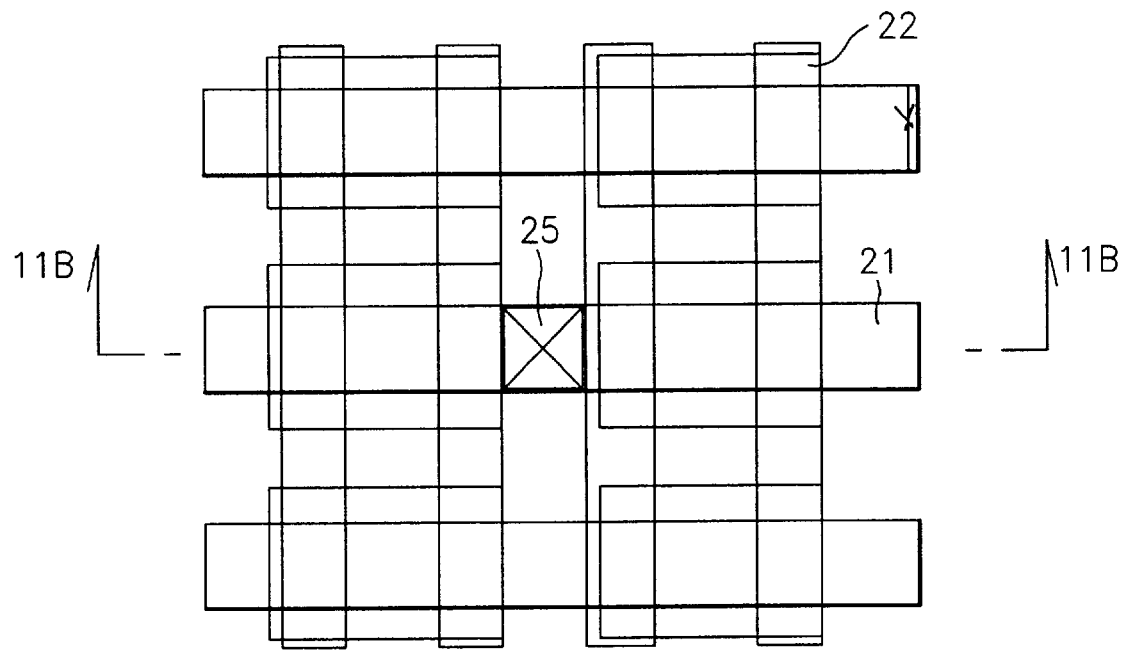
FIGS. 11A and 11B are layout and sectional views of a DRAM device, respectively, according to the second embodiment of the present invention.
Figure 11B:
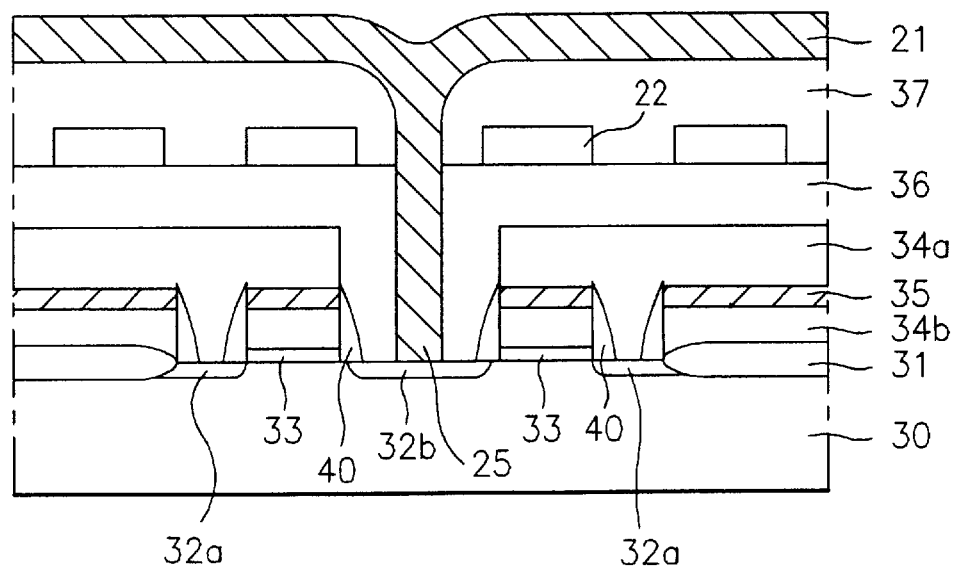

As shown in FIGS. 11A and 11B, the memory device includes a field oxide film 31 formed on an isolation region of a P-type semiconductor substrate 30, first and second impurity diffused regions 32a and 32b formed on an active region of the semiconductor substrate 30 defined by the field oxide film 31, a gate insulating film 33 formed on a channel region between the first and second impurity diffused regions 32a and 32b, a second gate 34b formed on the gate insulating film 33, a dielectric layer 35 formed on the second gate 34b, a first gate 34a formed on the dielectric layer 35 in contact with the first impurity diffused region 32a, a first interleave insulating film 36 formed on an upper side of the first gate 34a, a wordline 22 formed in contact with the second gate 34b, a second interleave insulating film 37 formed on the entire surface including the wordline 22, and a bitline 21 formed perpendicular to the wordline 22 and in contact with the second impurity diffused region 32b through a bitline contact hole 25 defined by the first interleave insulating film 36.

The method of fabricating the memory device according to the second embodiment of the present invention will be described with reference to FIGS. 12A to 12E.

Figure 12A:
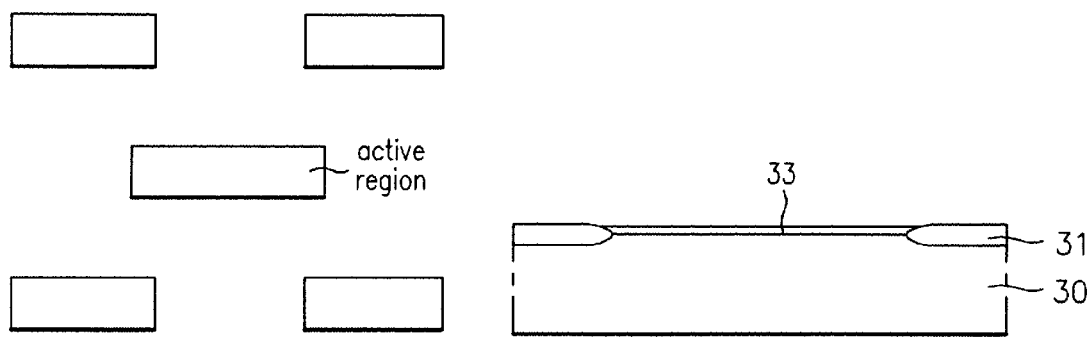
FIGS. 12A to 12E are sectional views for explaining sequential process steps of a DRAM device according to the second embodiment of the present invention.

As shown in FIG. 12A, the active region is defined by forming the field oxide film 31 on the isolation region of the semiconductor substrate 30 using a heat treatment in the ambient of $O_2$ with a pad oxide film and a nitride film as a mask for preventing oxidation. Then, the gate insulating film 33 is formed on the active region of the semiconductor substrate 30.

Figure 12B:
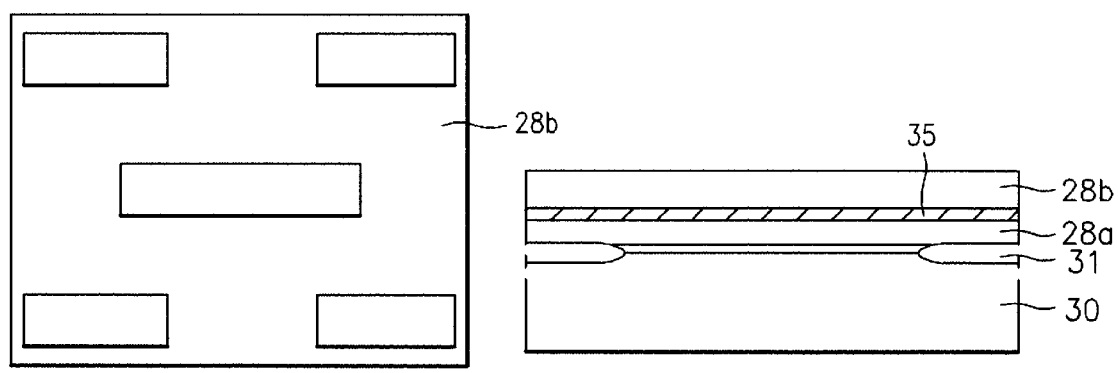

Subsequently, as shown in FIG. 12B, a first polysilicon layer 28a for forming the second gate 34b and a dielectric layer 35 are sequentially formed on the entire surface of the semiconductor substrate 30 over the gate insulating film 33 by LPCVD (low pressure chemical vapor deposition). The dielectric layer 35 is formed with a certain thickness and a dielectric ratio of 3.0 or more, using a silicon oxide film having a thickness of 50–1000 A. The thickness and dielectric ratio of the dielectric layer 35 must be formed to induce a voltage 0.1 V1 or more into the first gate 34a. The voltage 0.1 V1 or more is induced when a voltage V1 is applied to the second gate 34b. On the dielectric layer 35, a second polysilicon layer 28b for forming the first gate 34a is formed by LPCVD.

Figure 12C:
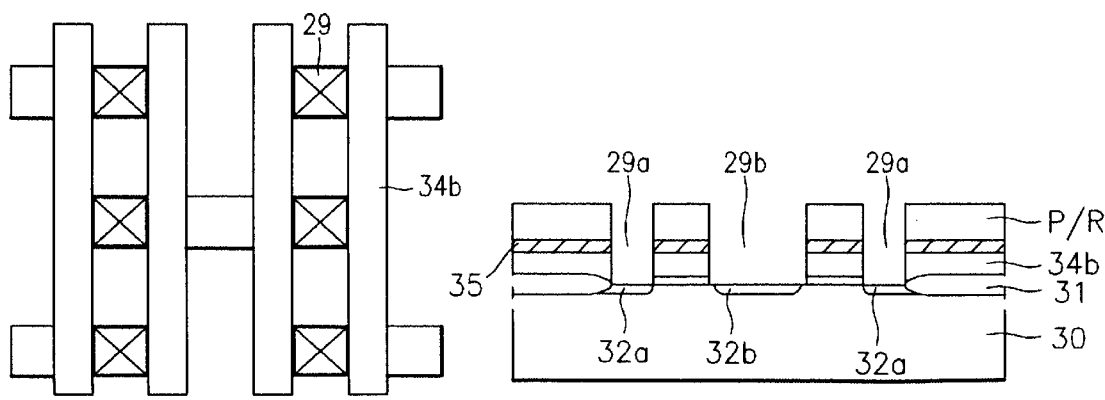

Then, as shown in FIG. 12C, the second polysilicon layer 28b, the dielectric layer 35, and the first polysilicon layer 28a are selectively etched to form contact holes 29a and 29b. The contact hole 29b is used to forming the second impurity diffused region 32b by ion implantation therethrough. The contact hole 29a is used to form a first gate contact hole 29 (shown in FIG. 12D) and the first impurity diffused region 32a by ion implantation. That is, the first and second impurity diffused regions 32a and 32b are formed by ion implantation through the contact holes 29a and 29b and by using a heat treatment. At this time, ion implantation is performed by impurities such as P and As in case of n-MOS and such as B and Sb in case of p-MOS.

Figure 12D:
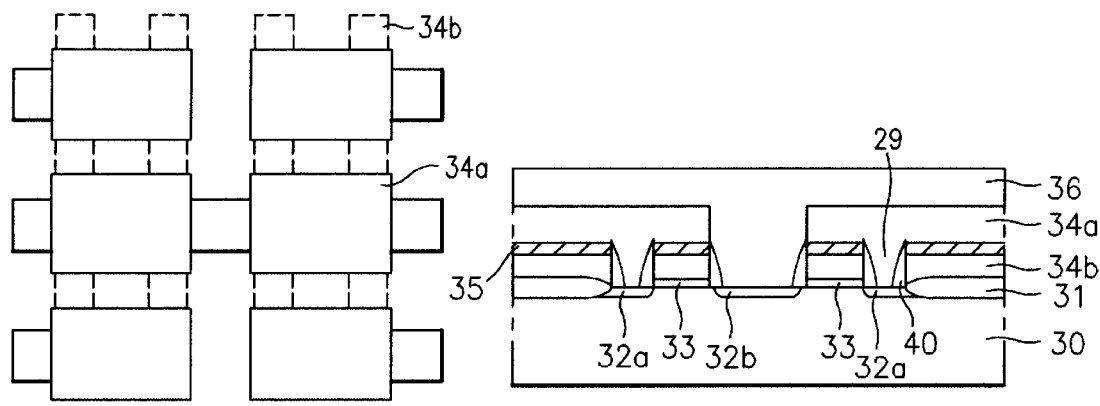

Then, as shown in FIG. 12D, the sidewall oxide film 40 is formed at the sides of the contact holes 29a and 29b by forming an oxide film on the entire surface and etching back portions of the formed oxide film.

Then, the second polysilicon layer 28b is formed for the second time in contact with the first impurity diffused region 32a. A portion of the second polysilicon layer 28b is removed from the contact hole 29b to form the first gate 34a. Subsequently, the first interleave insulating film 36 is formed on the entire surface over the first gate 34a and the second impurity diffused region 32b. Then the first interleave insulating film 36 is selectively removed to form a wordline contact hole.

Figure 12E:
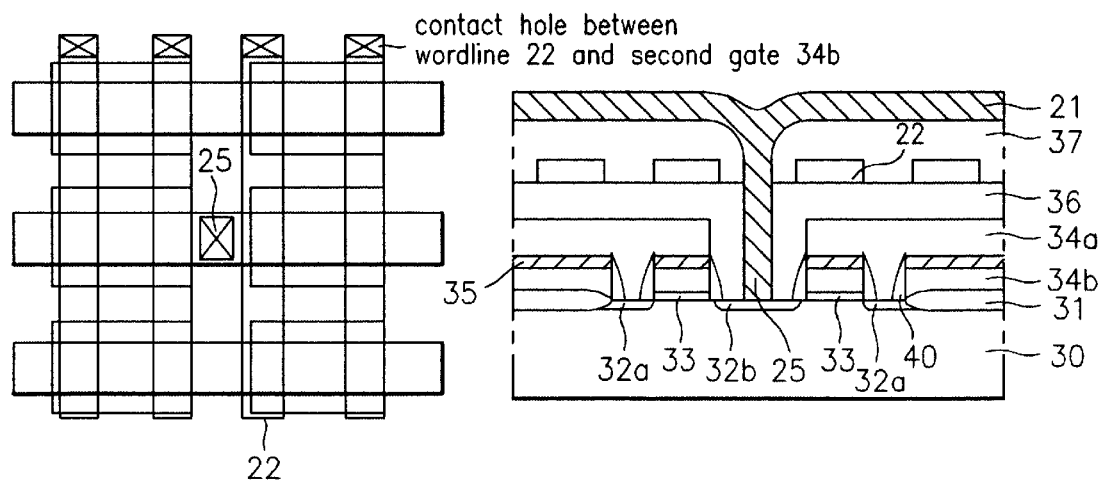

As shown in FIG. 12E, the wordline 22 is formed by depositing and patterning a conductivity type material on the first interleave insulating film 36. At this time, the wordline 22 is formed in such a way that it contacts the second gate 34b where the cell block is not formed, although this is not shown in the drawing.

The second interleave insulating film 37 is formed on the entire surface including the wordline 22. Then, portions of the first and second interleave insulating films 36 and 37 are removed to form the bitline contact hole 25.

The bitline 21 is formed in contact with the second impurity diffused region 32b by depositing and patterning a conductivity type material on the entire surface including the bitline contact hole 25.

Another example of the memory device according to the second embodiment of the present invention will be described with reference to FIGS. 13A and 13B.

Figure 13A:
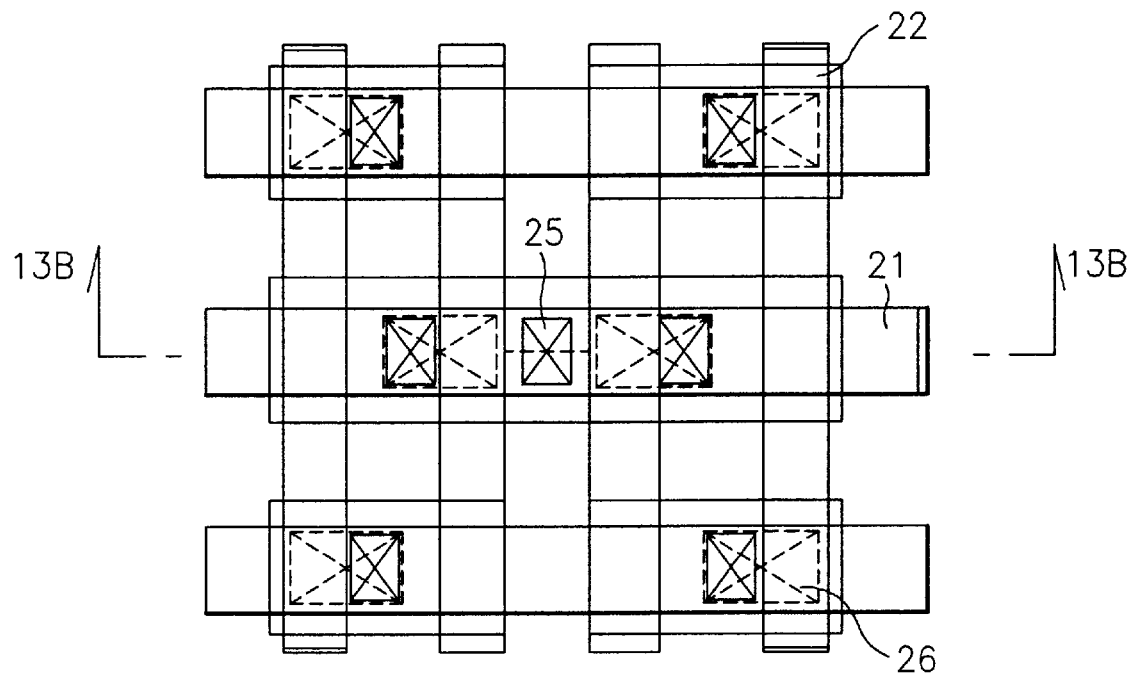
FIGS. 13A and 13B are another example of layout and sectional views of a DRAM device according to the second embodiment of the present invention.
Figure 13B:
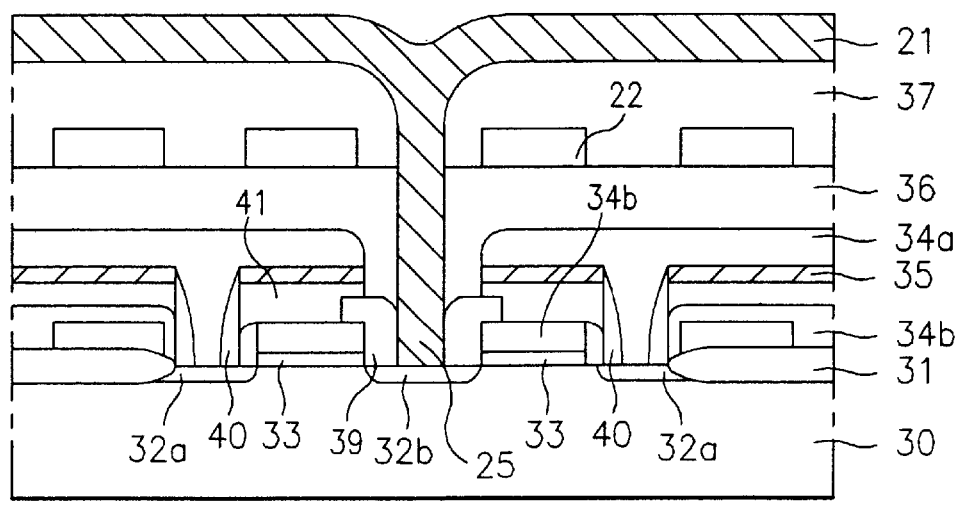

As shown in FIGS. 13A and 13B, the memory device according to the second embodiment of the present invention includes a field oxide film 31 formed on an isolation region of a P-type semiconductor substrate 30, first and second impurity diffused regions 32a and 32b formed on an active region of the semiconductor substrate 30 defined by the field oxide film 31, a gate insulating film 33 formed on a channel region between the first and second impurity diffused regions 32a and 32b, a second gate 34b formed on the gate insulating film 33, an inner layer or a second gate contact layer 41 formed in contact with the second gate 34b on the upper side of the second gate 34b, a dielectric layer 35 formed on the second gate contact layer 41, a first gate 34a formed on the dielectric layer 35 in contact with the first impurity diffused region 32a through the first gate contact hole 29, a first interleave insulating film 36 formed with the wordline contact hole 26 on an upper side of the first gate 34a, a wordline 22 formed in contact with the second gate 34b through the wordline contact hole 26 outside of the cell block, a second interleave insulating film 37 formed on the entire surface including the wordline 22, and a bitline 21 formed perpendicular to the wordline 22 and in contact with the second impurity diffused region 32b through the bitline contact hole 25 defined by the first and second interleave insulating films 36 and 37 and the oxide film 39.

The method of fabricating the memory device according to the second embodiment of the present invention will be described with reference to FIGS. 14A to 14E.

Figure 14A:
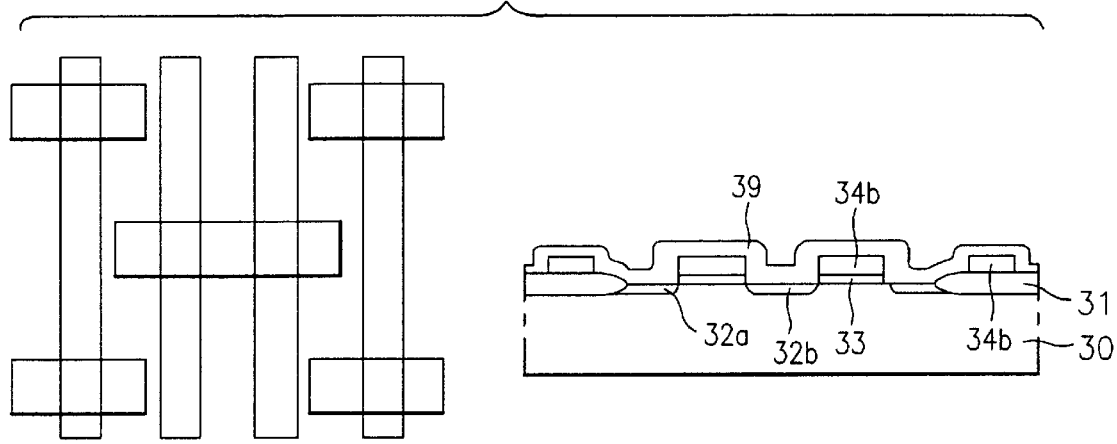
FIGS. 14A to 14E are sectional views for explaining another example of sequential process steps of a DRAM device according to the second embodiment of the present invention.

As shown in FIG. 14A, the active region is defined by forming the field oxide film 31 on an isolation region of the semiconductor substrate 30 by heat treatment in the ambient of $O_2$ using a pad oxide film and a nitride film as a mask for preventing oxidation. Then, the gate insulating film 33 is formed on the active region of the semiconductor substrate 30.

On the gate insulating film 33, a first polysilicon layer is formed and patterned to form the second gate 34b. Then, the first and second impurity diffused regions 32a and 32b are formed by ion implantation of impurities such as P and As in case of n-MOS and B and Sb in case of p-MOS using the second gate 34b as a mask. Then the oxide film 39 is formed on the entire surface including the first and second impurity diffused regions 32a and 32b and the second gate 34b.

Figure 14B:
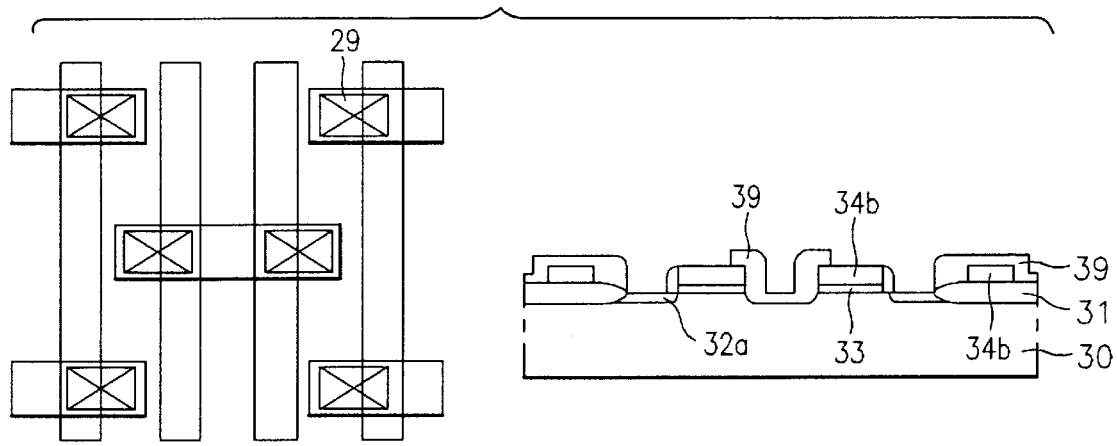

Subsequently, as shown in FIG. 14B, the oxide film 39 is selectively etched to expose the first impurity diffused region 32a and portions of the second gates 34b near the second impurity diffused region 32b.

Figure 14C:
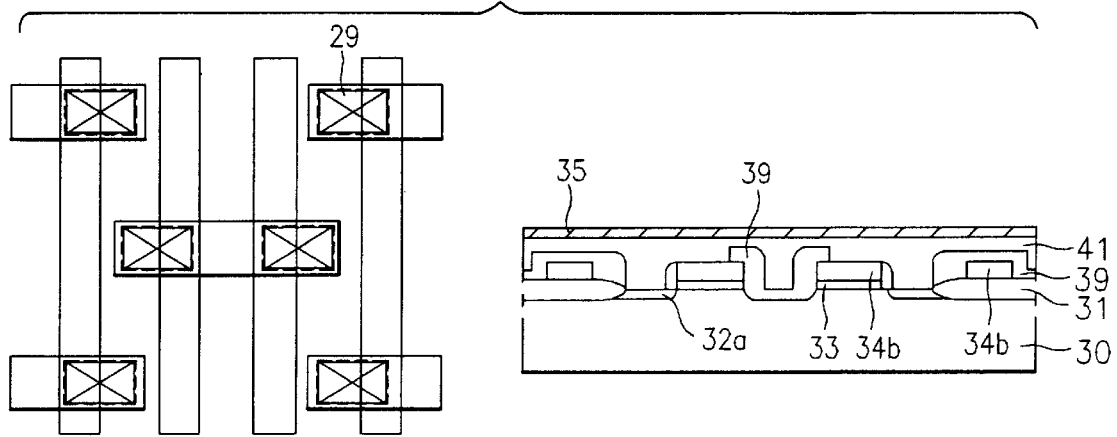

As shown in FIG. 14C, the second gate contact layer 41 is formed on the second gate 34b in contact with the first impurity diffused region 32a by LPCVD. Then on the second gate contact layer 41, the dielectric layer 35 is formed with a certain thickness and a dielectric ratio of 3.0 or more, using a silicon oxide film having a thickness of 50–1001 A. The thickness and dielectric ratio of the dielectric layer 35 must be formed to induce a voltage 0.1 V1 or more into the first gate 34a. The voltage 0.1 V1 or more results from a voltage V1 applied to the second gate 34b.

Figure 14D:
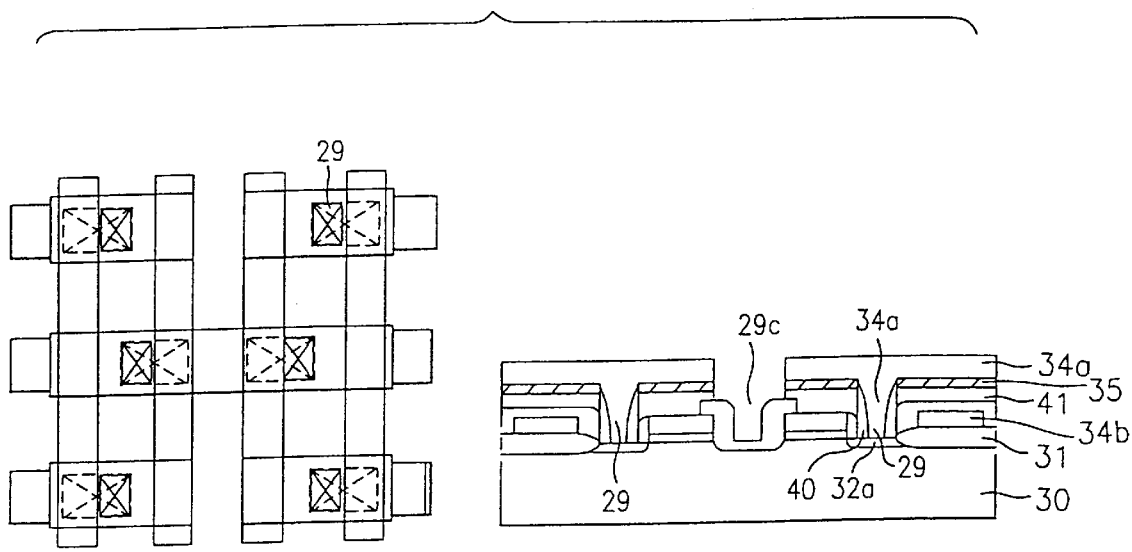

As shown in FIG. 14D, the dielectric layer 35 and second gate contact layer 41 above the first impurity diffused region 32a are etched to form the first gate contact hole 29.

Then at the sides of the first gate contact hole 29, a sidewall oxide film 40 is formed by etching back an oxide film formed on the entire surface. A second polysilicon layer for forming the first gate 34a is formed on the entire surface including the first gate contact hole 29 by LPCVP. Then, the second polysilicon layer, the dielectric layer 35 and the second gate contact layer 41 above the second impurity diffused region 32b are selectively removed to form the second gate 34b and a contact hole 29c.

Figure 14E:
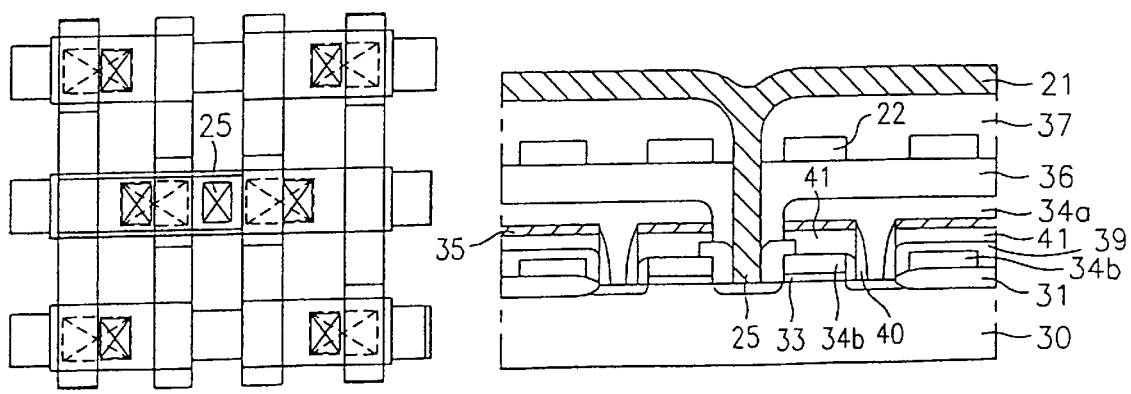

As shown in FIG. 14E, the first interleave insulating film 36 is formed on the entire surface including the contact hole 29c above the second impurity diffused region 32b. The first interleave insulating film 36 is selectively etched in the areas outside of the cell block to form a wordline contact hole. Then a conductivity type material for forming the wordline 22 is deposited on the entire surface and in the wordline contact hole so as to contact the second gate 34b. That is, the wordline 22 is formed in such a way that it contacts the second gate 34b where the cell block is not formed, although this is not specifically shown in the drawings. Then the deposited conductivity type material is patterned as the wordline 22.

Then the second interleave insulating film 37 is formed on the entire surface including the wordline 22. Then the first interleave insulating film 36 and the second interleave insulating film 37 are selectively removed to form the bitline contact hole 25.

The bitline 21 is formed by depositing and patterning a conductivity type material on the entire surface including the bitline contact hole 25.

Now, the data writing, data reading and data refreshing of the memory device according to the second embodiment of the present invention will be described.

The data writing, data reading and data refreshing of the memory device according to the second embodiment of the present invention may be classified into two operation steps depending on a voltage applied to the bitline and the wordline at the standby state.

Figure 15A:
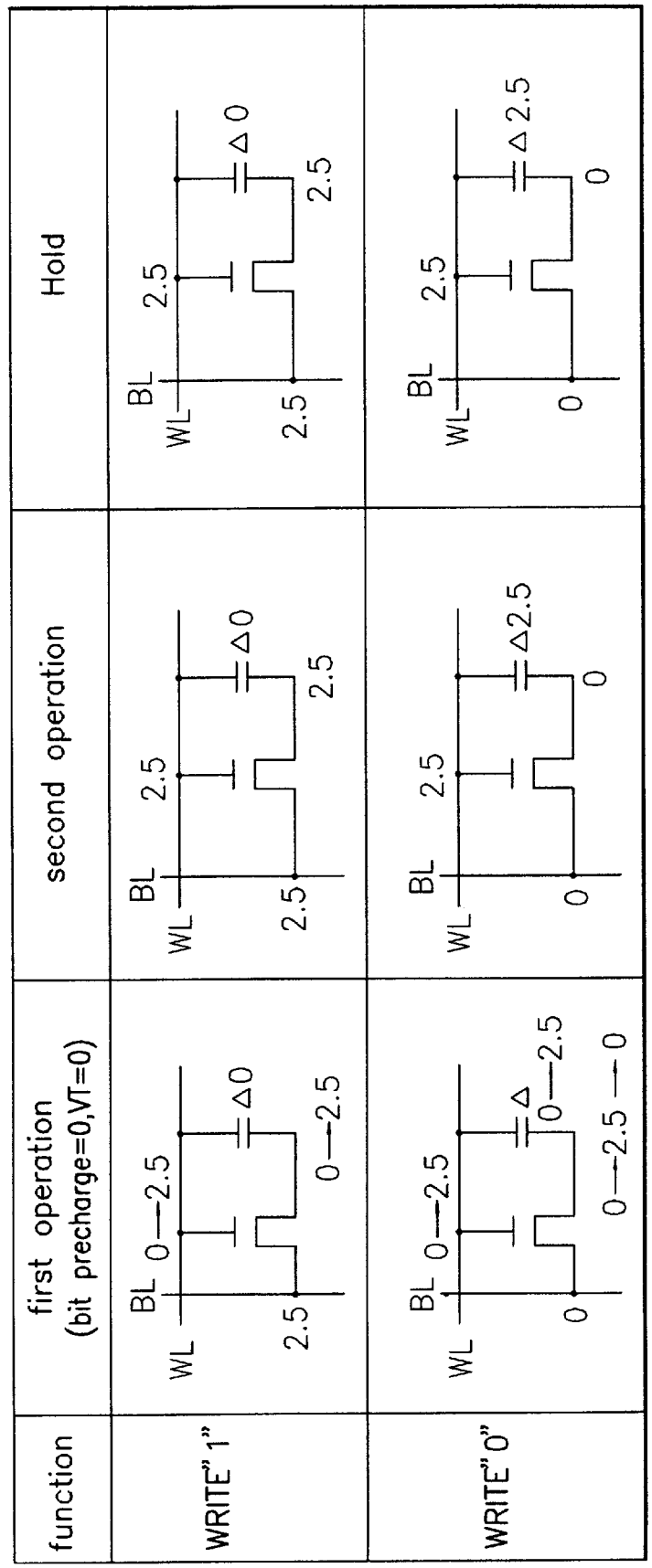
FIGS. 15A and 15B show tables for explaining operation steps of a DRAM device according to the second embodiment of the present invention.
Figure 15B:
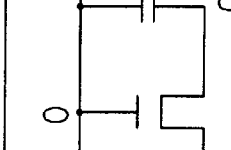

The first operation steps of the memory device according to the second embodiment of the present invention will be described with reference to FIGS. 15A and 15B.

In general, at the standby state, a ground potential voltage VG or low voltage VL of the semiconductor substrate 30 is applied to the wordline 22 so that the cell transistor is in the power-off state. Then the drain electrode 24b is disconnected from the bitline 21. At this time, a threshold voltage of the cell transistor is presumed to be 0 V.

The data writing operation steps will be described referring to FIG. 15A.

The writing operation of a logic value '1' is as follows.

A high voltage VH of 2.5 V is applied to the bitline 21 and the wordline 22 is selected so that a writing voltage of 2.5 V (which is more than a threshold voltage capable of operating a cell transistor) is applied to the second gate 23b. As a result, the high voltage VH is induced into the second gate 23b and the drain electrode 24b being connected to the second gate 23b by a capacitive coupling. Thus the cell transistor is maintained in the power-off state.

That is, the voltage at the source electrode 24a and the drain electrode 24b is the same as the voltage of the second gate 23b or higher so that the cell transistor enters the power-off state. At this time, data corresponding to 0 V is stored in the capacitor. The stored data remains until the data reading is performed.

The writing operation of a logic value '0' is as follows.

A ground potential voltage or a low voltage VL is applied to the bitline 21 and the wordline 22 is selected so that a high voltage VH of 2.5 V (which is more than the threshold voltage for operating a cell transistor) is applied to the second 23b. As a result, the high voltage VH is induced into the first gate 23a and the drain electrode 24b by a capacitive coupling. Thus, the power-on state of the cell transistor is maintained.

Since the electron potential energy $-qVG=0$ of the bitline 21 is higher than the electron potential energy $-qVH$ of the drain electrode 24b, the electrons flow from the bitline 21 to first gate 23a. The voltage of the drain electrode 24b becomes as low as 0 V by flowing the electrons to the first gate 23a.

As aforementioned, since the electron potential of the bitline 21 becomes identical to that of the drain electrode 24b if the voltage of the drain electrode 24b is low, the induced charge is not transferred any more and the charge corresponding to a high voltage VH is accumulated at both ports of the capacitor. Thereafter, the voltage of the wordline 22 is maintained as high as VH so that the cell transistor is in the power-off state.

The data reading operation steps will be described with reference to FIG. 15B.

The reading operation of a logic value '1' is as follows.

First, the bitline 21 is pre-charged and a voltage VH of 2.5 V or a voltage VG of 0 V is applied to the pre-charged bitline 21. Then, the wordline 22 is selected so that a reading voltage VG of 0 V is applied to the second gate 23b at the standby state of the wordline 22 having a voltage of 0 V. When data of a logic value '1' is stored in the first gate 23a, a high voltage VH is applied to the bitline 21. Thus, the voltage of the second gate 23b is identical to that of the voltage of the source electrode 24a or the drain electrode 24b, or higher so that the cell transistor is in the power-off state.

When the cell transistor switches to the power-off state, the path between the source drain electrode 24a and the drain electrode 24b is intercepted. Thus, the charge corresponding to 0 V is stored in the capacitor.

In addition, data corresponding to a logic value '0' is stored in the first gate 23a in case where the voltage VG is applied to the bitline 21. Thus, if the voltage of the wordline 22 is changed from VH to VG, a low voltage VG–VH of −2.5 V is induced into the first gate 23a and the drain electrode 24b by a capacitive coupling. The voltage of the first gate 23a becomes lower than that of the second gate 23b. As a result, the cell transistor is in the power-on state.

Further, the potential energy $-qVG$ of the bitline 21 becomes lower than the electron potential energy $-qVG+qVH$ so that the electrons flow from the drain electrode 24b to the bitline 21. Thus, the charge corresponding to VG–VH is applied to the bitline 21.

On the other hand, the voltage of the drain electrode 24b becomes as high as VG again so that the electron potential of the bitline 21 is identical to the electron potential VG of the drain electrode 24b. Then the charge is not transferred any more. That is, the cell transistor enters the power-off state and data corresponding to 0 V is accumulated in the capacitor. The data remains until the data writing or data refreshing is performed.

In the data writing and reading operations according to the second embodiment of the present invention, data corresponding to a logic value '1' or '0' can be stored in the second gate 23b and the stored data can only be read in case where the logic value '0' to operate the memory cell.

Figure 16A:
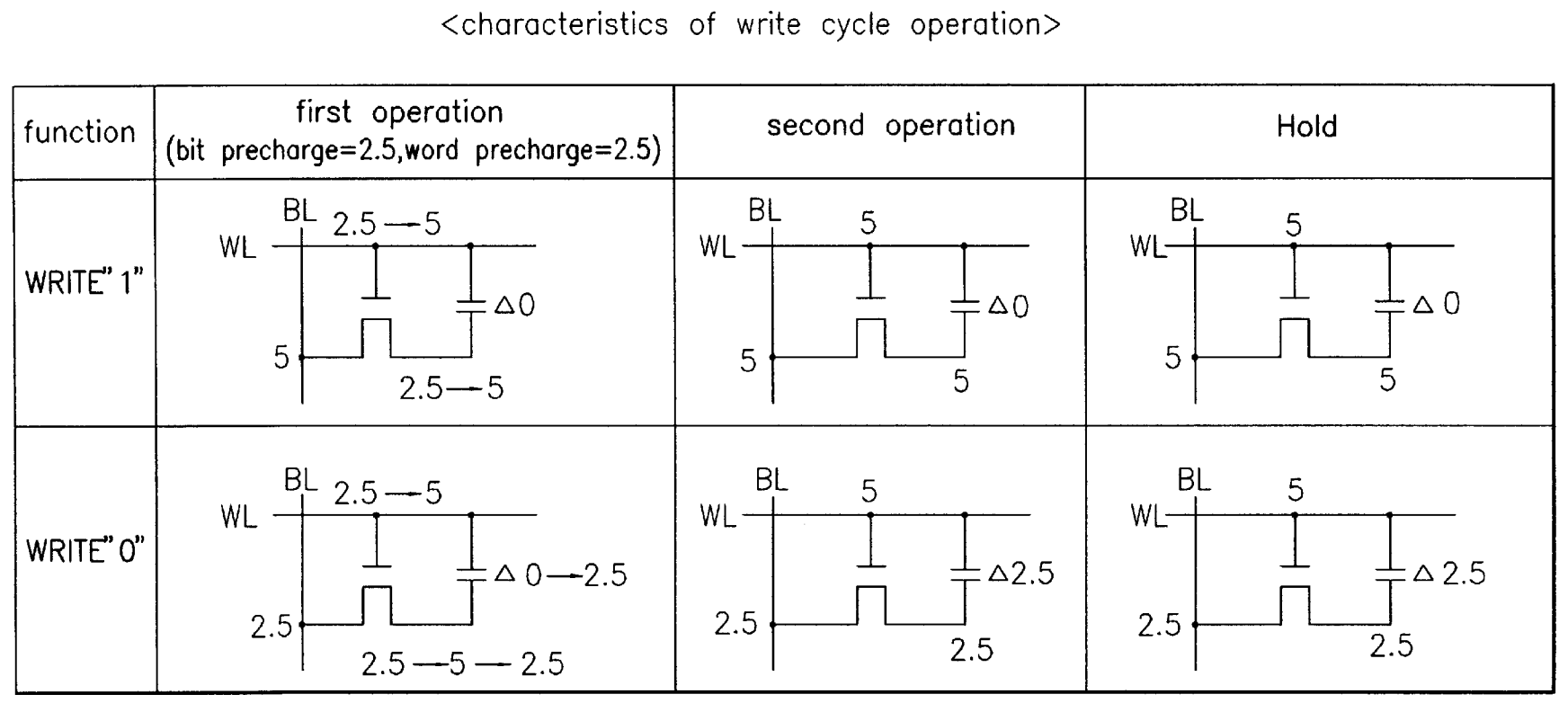
Figure 16B:
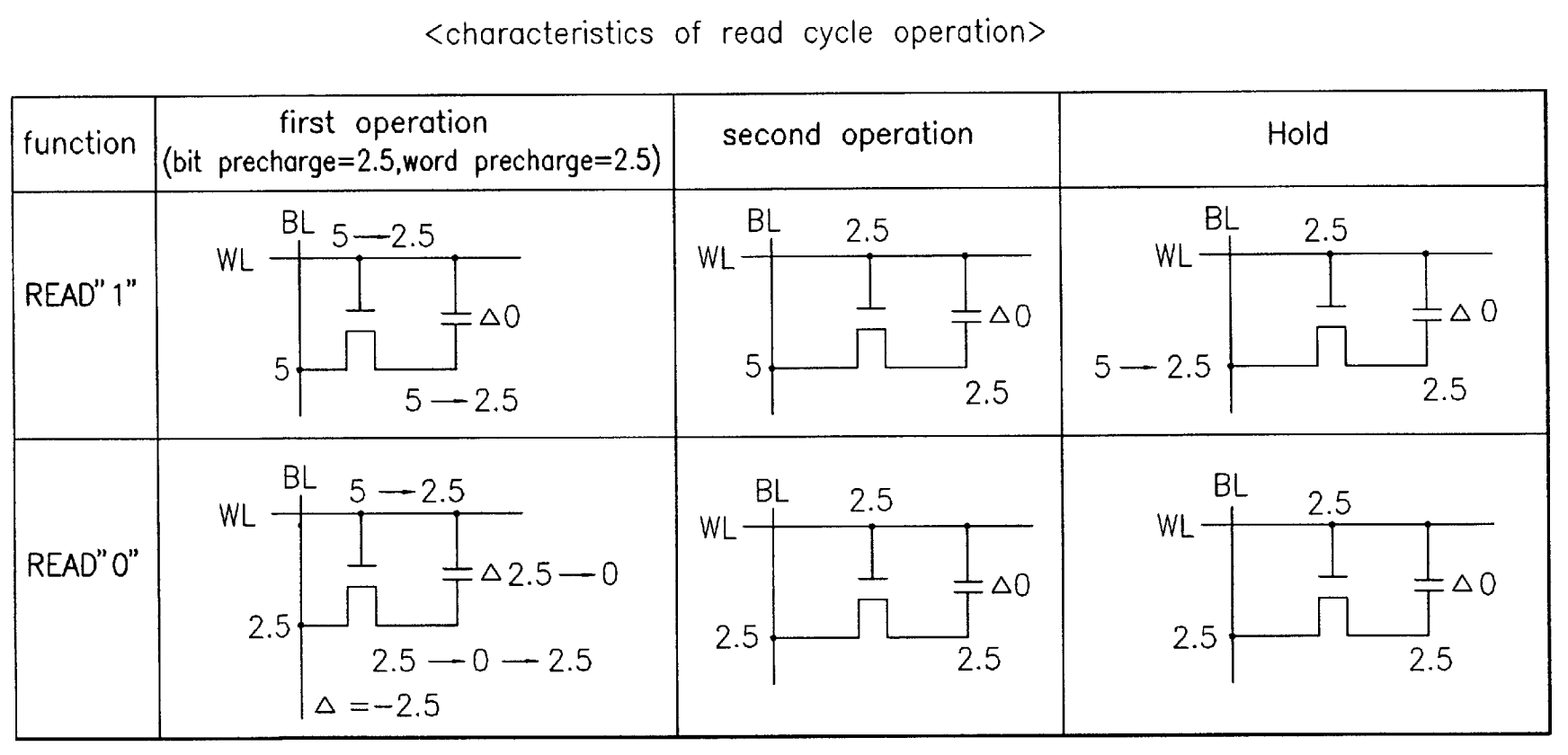

In the read cycle as described above, a signal corresponding to VG–VH of −2.5 V is applied to the bitline 21 in case the logic value is '0', whereas no signal is applied to the bitline 21 in case the logic value is '0'. Thus, the stored data can be discriminated. value is '0'. Thus, the stored data can be steps of a DRAM device according to the second embodiment of the present invention. The operation steps of the DRAM device as shown in FIGS. 16A and 16B are identical to those of FIGS. 15A and 15B, except the following. In the write cycle and read cycle, the wordline 22 and the bitline 21 are pre-charged at ½ VH of 5 V when the cell transistor is in the power-on state or power-off state.

The memory device according to the present invention as aforementioned has the following effects.

First, a separate capacitor is not needed when storing data, which reduces the area of a unit cell and improves integration of the device.

Second, the capacitor having a three-dimensional structure is not needed and a number of conductive layers are not needed, which reduces step differences. Thus, exposure and etching processes are improved and the yield of the device is also improved.

Third, overall process steps such as a heat treatment process can be reduced so that the cost in fabricating the device is reduced.

Finally, since a unit cell can include a single cell transistor, it is possible for the bitline to form a metal line. In addition, the gate straps of the wordline can be increased or the wordline can be pre-charged. Consequently, the speed of data transfer and signal-to-noise ratio is improved.

It will be apparent to those skilled in the art that various modifications and variations can be made in the memory cell, the memory device and the method of fabricating the same of the present invention without departing from the spirit or scope of the invention. Thus, it is intended that the present invention cover the modifications and variations of the invention provided they come within the scope of the appended claims and their equivalents.

What is claimed is:

1. A memory device comprising:

plurality of first and second impurity diffused regions formed on a semiconductor substrate;

a gate insulating film formed on the semiconductor substrate between the first and second impurity diffused regions;

a second gate directly contacting with the first impurity diffused regions;

a dielectric layer formed on the second gate;

a first gate formed on the dielectric layer;

at least one wordline formed in contact with the first gate; and at least one bitline formed in contact with one of the second impurity diffused regions.

2. The memory device according to claim 1, further comprising:

a first interleave insulating layer formed on the first gate and defining a wordline contact hole through which the one wordline contacts the first gate; and a second interleave insulating layer formed on the first interleave insulating layer and over the one wordline.

3. The memory device according to claim 2, wherein the one bitline contacts the second impurity diffused region through a bitline contact hole, the bitline contact hole being formed through the first and second interleave insulating layers.

4. The memory device according to claim 1, wherein the dielectric layer has a thickness and a dielectric ratio capable of inducing more than one tenth of a voltage applied to the first gate.

5. A memory device comprising:

a plurality of first and second impurity diffused regions formed on a semiconductor substrate;

a second gate formed on the semiconductor substrate between the first and second impurity diffused regions;

an oxide film formed in contact with one of the second impurity diffused regions;

an inner layer directly contacting the first impurity diffused regions;

a dielectric layer formed on the inner layer;

a first gate formed on and directly contacting the dielectric layer;

at least one wordline formed in contact with the first gate; and at least one bitline formed in contact with the one second impurity diffused region.

6. The memory device according to claim 5, further comprising:

a first interleave insulating layer formed on the first gate and the oxide film and defining a wordline contact hole through which the one wordline contacts the first gate; and a second interleave insulating layer formed on the first interleave insulating layer.

7. The memory device according to claim 6, wherein the one bitline contacts the one second impurity diffused region through a bitline contact hole, the bitline contact hole being formed through the second interleave insulating layer, the first interleave insulating layer, and the oxide film.

8. The memory device according to claim 5, wherein the dielectric layer has a thickness and a dielectric ratio capable of inducing more than one tenth of a voltage applied to the first gate.

9. A memory device comprising:

a plurality of first and second impurity diffused regions formed on a semiconductor substrate;

a second gate formed on the semiconductor substrate between the first and second impurity diffused regions;

a dielectric layer formed on the second gate;

a first gate formed on the dielectric layer;

a first interleave insulating layer formed on the first gate;

at least one wordline formed in contact with the second gate through the first interleave insulating layer; and at least one bitline formed in contact with one of the second impurity diffused regions.

10. The memory device according to claim 9, further comprising:

a second interleave insulating layer formed on the first interleave insulating layer and over the one wordline.

11. The memory device according to claim 10, wherein the one bitline contacts the second impurity diffused region through a bitline contact hole, the bitline contact hole being formed through the first and second interleave insulating layers.

12. The memory device according to claim 9, wherein the dielectric layer has a thickness and a dielectric ratio capable of inducing more than one tenth of a voltage applied to the second gate.

13. A memory device comprising:

a plurality of first and second impurity diffused regions formed on a semiconductor substrate;

a second gate formed on the semiconductor substrate between the first and second impurity diffused regions;

an inner layer formed in contact with the second gate;

a dielectric layer formed on the inner layer;

a first gate formed on the dielectric layer and directly contacting one of the first impurity diffused regions;

at least one wordline formed in contact with the second gate; and at least one bitline formed in contact with one of the second impurity diffused regions.

14. The memory device according to claim 13, further comprising:

an oxide film formed in contact with the one second impurity diffused region and partially on the second gate.

15. The memory device according to claim 14, further comprising:

a first interleave insulating layer formed on the first gate and the oxide film and defining a wordline contact hole through which the one wordline contacts the second gate; and a second interleave insulating layer formed on the first interleave insulating layer and on the one wordline.

16. The memory device according to claim 15, wherein the one bitline contacts the one second impurity diffused region through a bitline contact hole, the bitline contact hole being formed through the first and second interleave insulating layers.

17. The memory device according to claim 13, wherein the dielectric layer has a thickness and a dielectric ratio capable of inducing more than one tenth of a voltage applied to the second gate.

* * * * *